(12) United States Patent
Oster et al.

(10) Patent No.: US 9,345,184 B2
(45) Date of Patent: May 17, 2016

(54) MAGNETIC FIELD SHIELDING FOR PACKAGING BUILD-UP ARCHITECTURES

(71) Applicant: Intel Corporation, Santa Clara, CA (US)

(72) Inventors: Sasha Oster, Chandler, AZ (US); Sarah Haney, Cary, NC (US); Weng Hong Teh, Phoenix, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 14/126,271

(22) PCT Filed: Sep. 27, 2013

(86) PCT No.: PCT/US2013/062349
§ 371 (c)(1),
(2) Date: Dec. 13, 2013

(87) PCT Pub. No.: WO2015/047324
PCT Pub. Date: Apr. 2, 2015

(65) Prior Publication Data
US 2015/0189797 A1  Jul. 2, 2015

(51) Int. Cl.
*H05K 9/00* (2006.01)
*H01L 23/552* (2006.01)
(Continued)

(52) U.S. Cl.
CPC .............. *H05K 9/0052* (2013.01); *B32B 37/24* (2013.01); *B32B 38/10* (2013.01); *B81B 7/0032* (2013.01); *B81B 7/02* (2013.01); *G06F 1/182* (2013.01); *H01L 23/552* (2013.01); *H01L 24/19* (2013.01); *H01L 24/96* (2013.01); *H05K 1/115* (2013.01); *B32B 2037/243* (2013.01); *B32B 2457/00* (2013.01); *H01L 21/568* (2013.01); *H01L 2224/04105* (2013.01); *H01L 2924/14* (2013.01); *H01L 2924/1434* (2013.01); *H01L 2924/1461* (2013.01); *Y10T 156/10* (2015.01)

(58) Field of Classification Search
CPC ..... H05K 9/0052; H05K 1/115; B81B 7/0032
See application file for complete search history.

(56) References Cited

U.S. PATENT DOCUMENTS

2004/0188811 A1  9/2004  Vandentop et al.
2008/0258293 A1  10/2008  Yang et al.
(Continued)

OTHER PUBLICATIONS

International Search Report and Written Opinion received for PCT Patent Application No. PCT/US2013/062349, mailed on Jun. 27, 2014, 12 pages.

*Primary Examiner* — Mamadou Diallo
(74) *Attorney, Agent, or Firm* — Green, Howard & Mughal LLP

(57) ABSTRACT

Magnetic field shielding material with high relative permeability incorporated into a build-up package, for example to restrict a field of a magnet integrated with the build-up to a target device configured to operate in the field. In embodiments, a first device is physically coupled to the build-up. In embodiments, a magnetic field shielding material is disposed in contact with the build-up and in proximity to the first device to restrict a magnetic field either to a region occupied by the first device or to a region exclusive of the first device. A field shielding material may be disposed within build-up near a permanent magnet also within the build-up to reduce exposure of another device, such as an IC, to the magnetic field without reducing MEMS device exposure.

22 Claims, 18 Drawing Sheets

(51) Int. Cl.
*H01L 23/00* (2006.01)
*B32B 37/24* (2006.01)
*B32B 38/10* (2006.01)
*B81B 7/00* (2006.01)
*B81B 7/02* (2006.01)
*G06F 1/18* (2006.01)
*H05K 1/11* (2006.01)
*H01L 21/56* (2006.01)

(56) References Cited

U.S. PATENT DOCUMENTS

2010/0061056 A1\* 3/2010 Searls et al. ............. 361/679.56
2011/0147917 A1 6/2011 England et al.
2011/0316129 A1 12/2011 Katti
2012/0119338 A1 5/2012 Watanabe et al.

\* cited by examiner

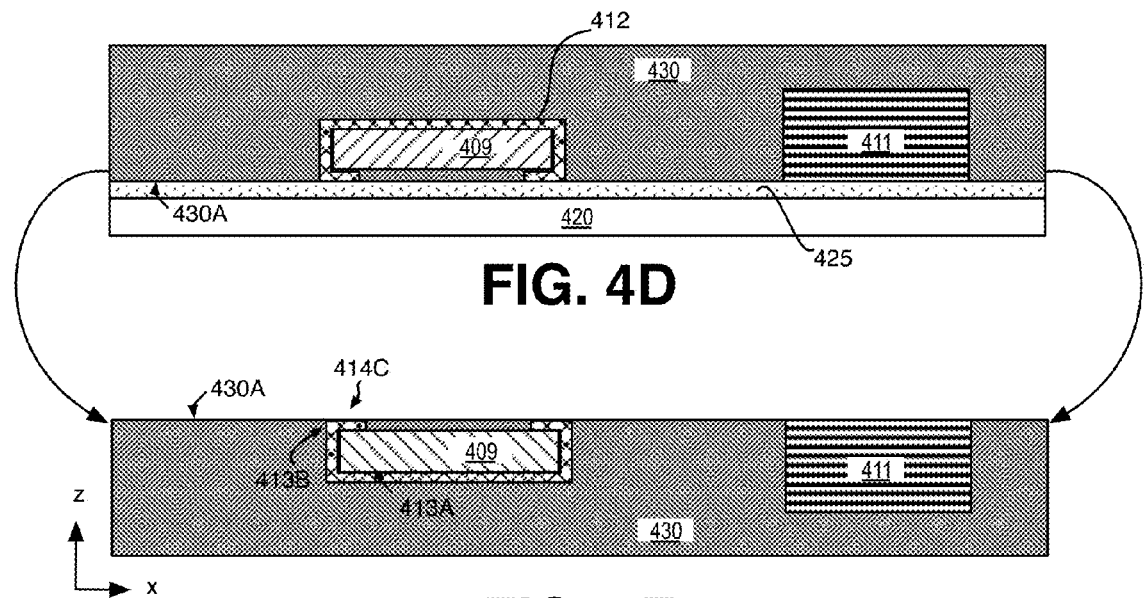
FIG. 4D
FIG. 4E
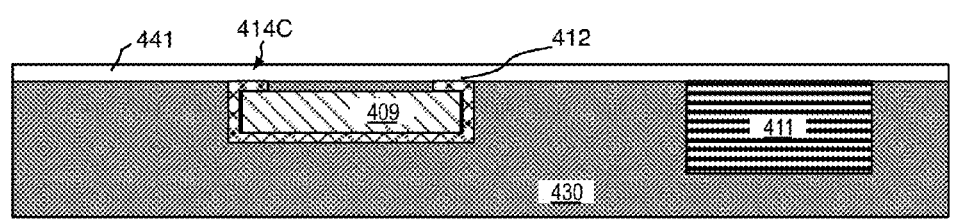
FIG. 4F
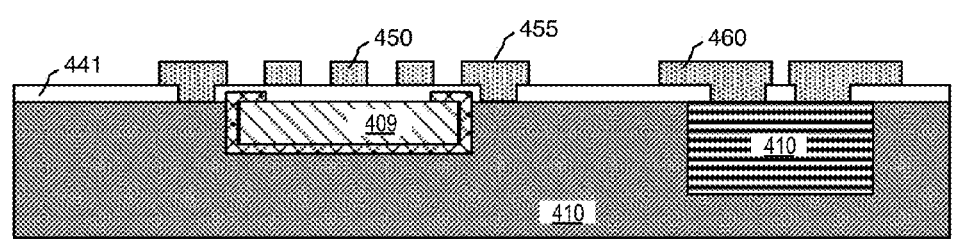
FIG. 4G

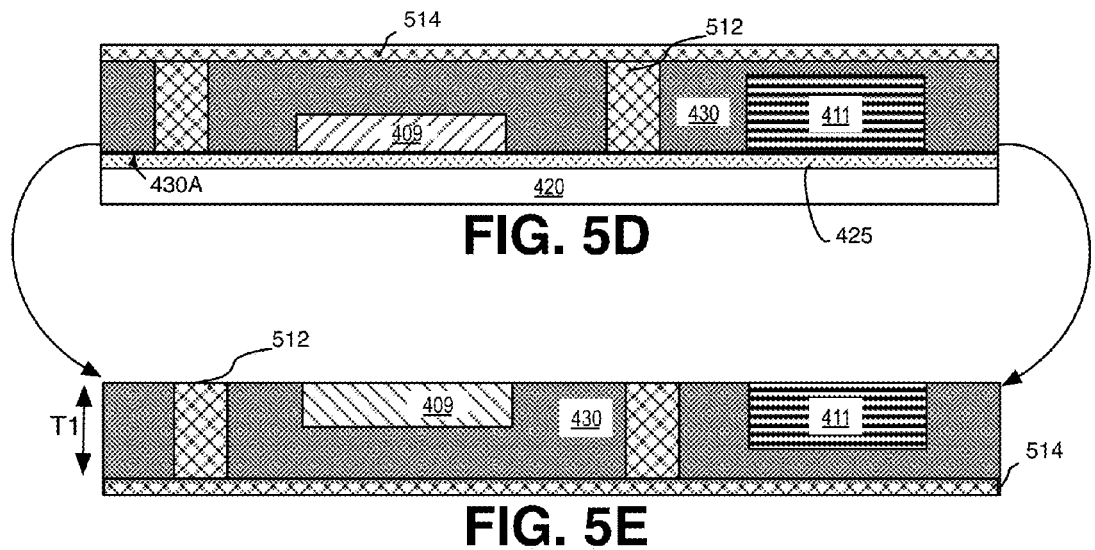
FIG. 5D
FIG. 5E
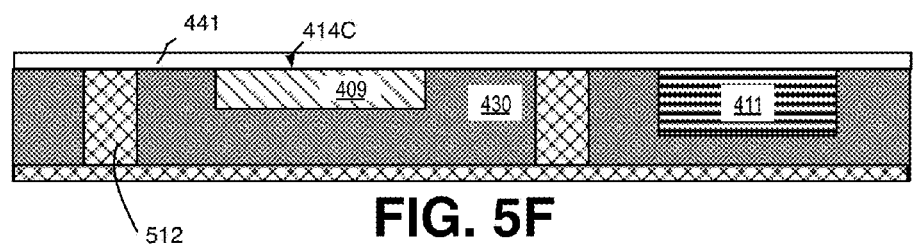
FIG. 5F
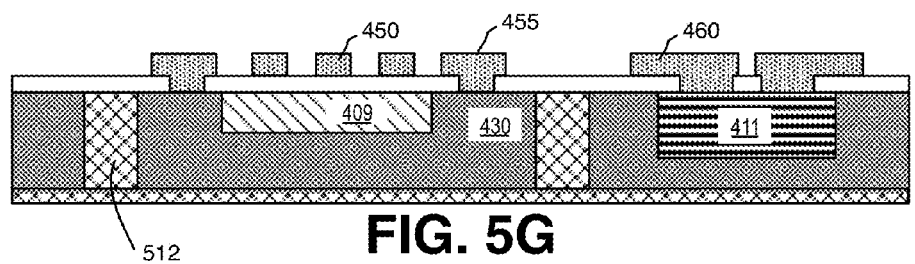
FIG. 5G

MAGNETIC FIELD SHIELDING FOR PACKAGING BUILD-UP ARCHITECTURES

TECHNICAL FIELD

Embodiments of the invention are generally related to magnetic field shielding in packaging for microelectronic devices, and more particularly pertain to magnetic field shielding in build-up packaging.

BACKGROUND

Microelectronic devices are typically contained in a package that allows a connection to another device, such as a printed circuit board. Microelectronic packaging technology, including methods to mechanically and electrically attach a device die or chip (e.g., a microprocessor) to a substrate or other carrier, continues to be refined and improved. Bumpless Build-Up Layer (BBUL) technology is one packaging architecture. Among its advantages, BBUL eliminates the need for traditional die assembly processes, eliminates first-level solder ball interconnections (e.g., flip-chip interconnections), reduces stress on low-k interlayer dielectrics within chips due to die-to-substrate coefficient of thermal expansion (CTE) mismatch, and reduces package inductance through elimination of the package core and flip-chip interconnect for improved input/output (I/O) and power delivery performance.

Microelectromechanical systems (MEMS) devices are micro or nano scale devices that integrate mechanical and electrical elements on a common substrate typically using microfabrication technology commonly employed in integrated circuit (IC) manufacturing. The mechanical elements are fabricated using lithographic processes on a substrate to selectively pattern the devices. Additional layers are often added to the substrates and then micromachined until the MEMS device is in a designed configuration. Exemplary MEMS devices include actuators, sensors, switches, accelerometers, gyroscopes, etc.

Prior work by the inventors includes a number of architectures and techniques for fabricating or otherwise embedding MEMS devices into BBUL packaging architectures, some of which are inductively coupled in one manner or another. For inductively coupled MEMS devices, drive and/or sense transduction between mechanical displacement and electrical circuitry is achieved, at least in part, via a magnetic (B) field. Inductively coupled MEMS devices are also known as "magnetic MEMS" in reference to the presence of a permanent magnet disposed in close proximity to mechanical members of the MEMS device to concentrate magnetic field lines for improved MEMS device sensitivity.

Magnetic fields relied upon by one device, such as a magnetic MEMS device, may however detrimentally impact another device, particularly when devices are embedded in a same package build-up.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements. Further, reference labels have been repeated among the figures to indicate corresponding or analogous elements. In the figures:

FIGS. 4A, 4B, 4C, 4D, 4E, 4F, 4G, 4H, 4I, and 4J illustrate cross-sectional views of a packaging build-up structure with magnetic field shielding as a packaging build-up method is performed in accordance with an embodiment;

FIGS. 5A, 5B, 5C, 5D, 5E, 5F, 5G, 5H, 5I, and 5J illustrate views of a packaging build-up structure with magnetic field shielding as a packaging build-up method is performed in accordance with an embodiment;

DETAILED DESCRIPTION

Figure 1A:
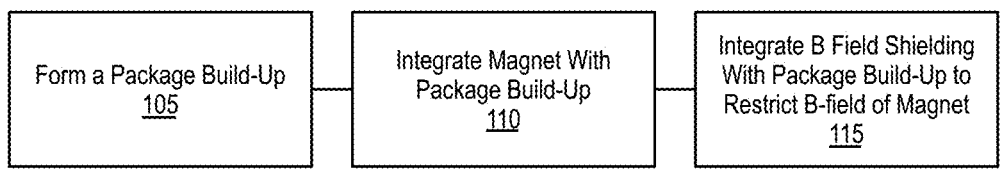
FIG. 1A is a block diagram illustrating a method for integrating magnetic field shielding into a device package, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Terms such as "upper" and "lower" "above" and "below" may be understood by reference to illustrated X-Z coordinates, and terms such as "adjacent" may be understood by reference to X, Y coordinates or to non-Z coordinates. Therefore, the following detailed description is not to be taken in a limiting sense and the scope of claimed subject matter is defined solely by the appended claims and their equivalents.

In the following description, numerous details are set forth, however, it will be apparent to one skilled in the art, that the present invention may be practiced without these specific details. In some instances, well-known methods and modules are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicate that two or more elements are in either direct or indirect (with other intervening elements between them) physical, optical, electrical, or electromagnetic contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As described in greater detail below, Described herein are embodiments of magnetic shielding architectures and techniques that may be integrated into a BBUL process. In exemplary embodiments, magnetic shielding is integrated into a BBUL process that is further employed to fabricate a magnetic MEMS device. Such magnetic shielding may advantageously confine or restrict B fields to within the MEMS package or significantly reduce the magnetic field outside the MEMS package. Even more advantageously confine or restrict B fields to within only that portion of a package in which a MEMS device is located.

FIG. 1A is a block diagram illustrating a method 101 for integrating magnetic field shielding into a device package, in accordance with an embodiment. In method 101, a package build-up is formed at operation 105. As described further elsewhere herein, the packaging build-up includes a plurality of alternating layers of patterned conductive material and insulating material that form a build-up. One or more device is physically attached to the build-up with one or more electrodes of the device electrically coupled to at least one of the patterned conductive material of the build-up. Packing build-up technology is bumpless (i.e., BBUL) as the electrical connections between the build-up and the attached device are without bumps or balls (e.g., solder, etc.). Rather than joining a package and a device as two discrete objects, electrical connections extending from the device may be built directly upon the device during patterning of a conductive material layer of the build-up (e.g., through electroplating, etc.).

At operation 110 a magnet is integrated with the package build-up. In the exemplary embodiments, the magnet is a permanent magnet. With the dimensions of the package build-up being lager than a given packaged device, larger magnets with stronger magnetic fields may be utilized to improve performance of electromagnetic devices integrated with the device(s) at the package-level relative to a chip-level magnetic device architecture.

At operation 115, magnetic filed shielding is integrated with the package build-up to restrict the magnetic field of the magnet that was integrated with the package build-up at operation 110. In embodiments, the magnetic field shielding includes one or more material having a relative permeability ($\mu/\mu_0$) of at least 500, advantageously at least 4,000, more advantageously at least 10,000, and most advantageously greater than 20,000. Exemplary materials include permalloy, and Mu-metal, which have relative permeability of approximately 8,000 and 30,000, respectively. As a reference, both air and copper have a relative permeability of approximately 1. Materials of high permeability other than permalloy and Mu-metal may be utilized, and shielding material may have a designed thickness that depends, for example, on the relative permeability of the chosen shielding material, the strength of the magnetic field, as well as the proximity and sensitivity of potential victim. In exemplary embodiments described herein, thicknesses for permalloy or Mu-metal are in the range of a few microns to 2-4 mils, or more.

The magnetic field shielding material integrated at operation 115 is disposed in proximity to the magnet to restrict a magnetic field within the package build-up. The shielding material is to confine the magnetic field to a region of the build-up, for example occupied by the magnet and actuated device, or otherwise restrict the magnetic field of the magnet beyond a region of the build-up occupied by the magnet such that any neighboring devices (internal to the package build-up, or external of the package build-up) are exposed to substantially less magnetic field than they would experience otherwise. In embodiments, the magnetic field shielding includes at least one of a bottom-side field shielding material disposed below the magnet, and/or a top-side shielding material disposed over the magnet, and/or a lateral field shielding material disposed adjacent to the magnet.

Figure 3A:
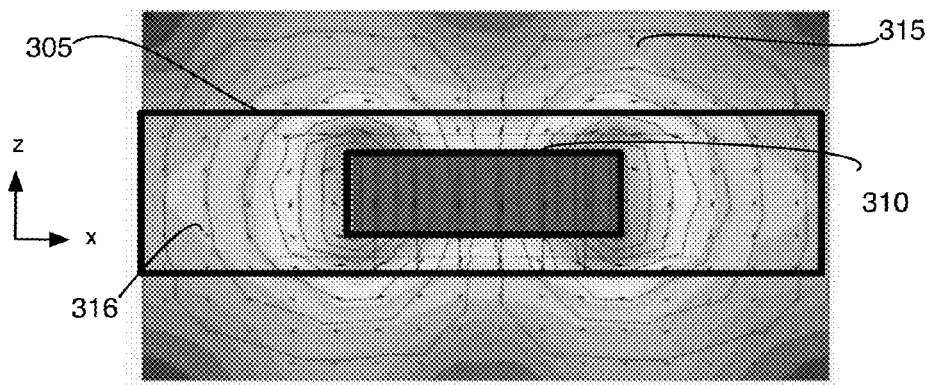
FIG. 3A illustrate magnetic field strength of a cross-sectional area of a packaged permanent magnet.
Figure 3B:
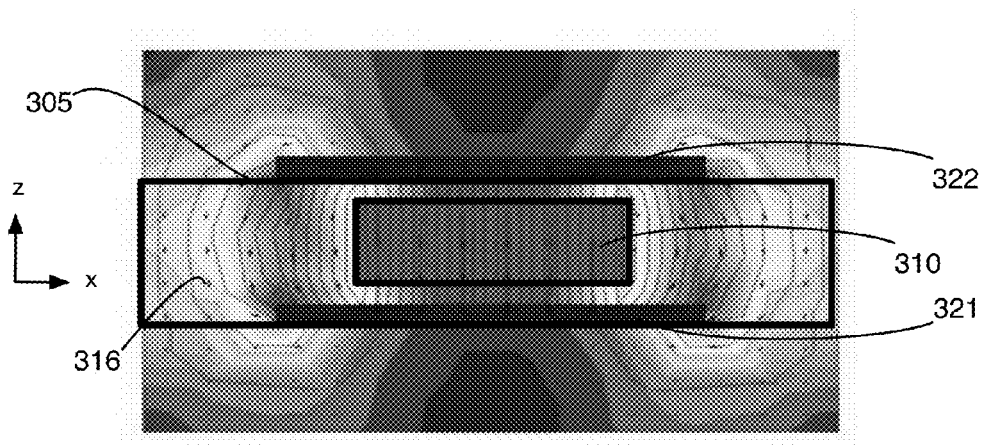
FIG. 3B illustrates magnetic field strength of a cross-sectional area of the packaged permanent magnet depicted in FIG. 3A for a first magnetic field shielding architecture.
Figure 3C:
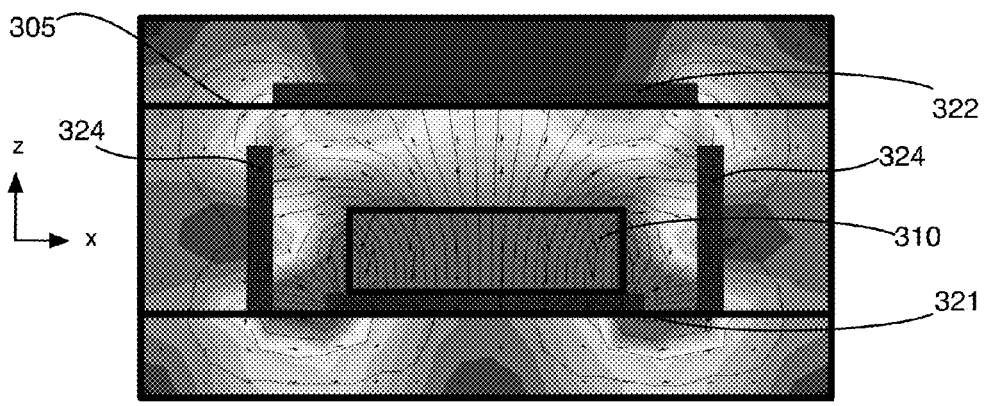
FIG. 3C illustrates magnetic field strength of a cross-sectional area of the packaged permanent magnet depicted in FIG. 3A for a second magnetic field shielding architecture.

FIGS. 3A-3C illustrate a modeled magnetic field strength within a cross-sectional area of a packaged permanent magnet, as simulated with a field solver based on various dimensions and materials present in a particular build-up package.

In FIG. 3A, package surfaces 305 surround magnet 310. In this example, magnet 310 is approximately 200 µm in the z-dimension with poles oriented substantially parallel to the z-dimension and package surfaces 305 are separated from each other by approximately 400 µm in the z-dimension. At such dimensions, absent a high permeability magnetic shielding material, significant field is found both beyond the z-dimension confines of the package build-up (e.g., contour 315) and laterally in the x-dimension within other regions of the package build-up (e.g., contour 316).

FIG. 3B illustrates a simulation of an embodiment where the magnetic shielding includes both a bottom-side field shielding material and a top-side shielding material. As shown, bottom-side shielding material 321 extends over an area of the package build-up and is disposed facing a first side of magnet 310. Top-side shielding material 322 likewise extends over an area of the package build-up and is disposed facing a second side of magnet 310. As shown, magnetic field strength beyond the package surfaces 305 is significantly reduced relative to the reference field depicted in FIG. 3A, and relative to the magnetic field extending laterally within the package build up. FIG. 3C illustrates a simulation of an embodiment where the magnetic shielding further includes a lateral field shielding material 324 disposed facing a third side of magnet 310. As shown, lateral field strength beyond the lateral field shielding material 324 is reduced relative to the fields in FIGS. 3A and 3B. Lateral field shielding material 324 may be utilized to confine magnetic field to only a portion of a package build-up, for example occupying an area not much larger than magnet 310 and a target device utilizing the magnetic field.

Figure 1B:
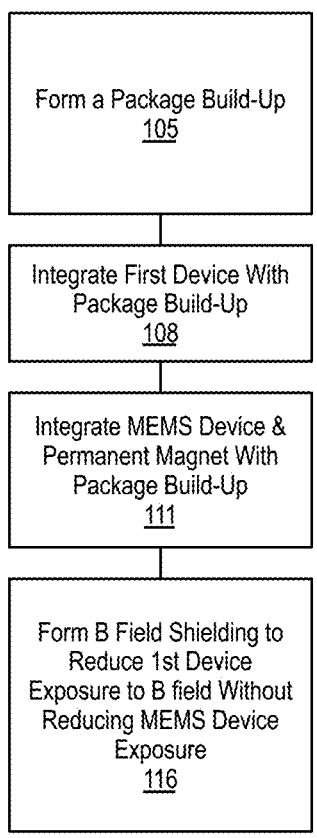
FIG. 1B is a block diagram illustrating a method for integrating magnetic field shielding into a device package that includes both a magnetic MEMS device and at least one other device, in accordance with an embodiment.

FIG. 1B illustrates a method 102 of integrating both a MEMS device with a magnet and magnetic shielding. Although method 102 is an exemplary embodiment of method 101 where a MEMS device is advantageously integrated with the magnetic shielding, alternative embodiments of method 101 may integrate a magnet and magnetic shielding (or just magnetic shielding alone) in a build-up package without any further integration of a MEMS device. Such an embodiment may be practiced for example where an inductor, or other electromagnetic device is integrated within a build-up package.

Method 102 includes formation of a package build-up at operation 105. At operation 108, a first device is integrated with the package build-up. The first device may be sensitive to magnetic fields. Exemplary devices include, but are not limited to, any IC (e.g., a microprocessor, memory chip, etc.), photonic (e.g., EAM, MOEMS, etc.), electromagnetic (e.g., buck-boost power supply, etc.), or MEMS device (e.g., with magnetically or capacitively coupled released members, etc.). At operation 111, a magnet and a MEMS device reliant on, or otherwise benefitted by, the field of the magnet are integrated with the first device on the package build-up. The MEMS device may be the only such device in the package or one of a plurality of such devices. The alternating conductive material layers separated by dielectric material layers within the build-up offers space (area and volume) for the MEMS device(s). Such areas or volumes are referred to herein as voids. In embodiments, a portion of such a void is utilized by the inclusion of the MEMS device(s) embedded within the build-up. Representative MEMS devices include sensors and actuators. Examples include, but are not limited to, resonators, switches, accelerometers, gyroscopes, biosensors, and photonic devices, etc. In certain embodiments where the MEMS device is magnetically coupled, the MEMS device includes a released member that is free to undergo static and/or dynamic mechanical deflection in the presence of a magnetic field during MEMS device operation.

Method 102 completes at operation 116 with formation of magnetic shielding to reduce magnetic field exposure of the first device without reducing magnetic field exposure of the MEMS device. In certain embodiments, a released member of a MEMS device is disposed between bottom-side and top-side field shielding materials (e.g. between materials 321, 322 in FIG. 3B). The released member may further be disposed adjacent to a lateral field shielding material (e.g., within confines of lateral shielding material 324 in FIG. 3C). For such embodiments, magnetic field confinement by the shielding may increase the field strength within the various shielding materials and thereby impart higher sensitivity to the MEMS device relative to a system integrated into a package lacking such confinement by increasing local field strength or field uniformity. As such, magnetic shielding embodiments may be advantageous not only for protecting the first device from exposure to the field of the packaged magnet, but also for improved performance of the packaged magnetic device configured to couple with the magnet.

In embodiments, a magnet is vertically integrated with a MEMS device fabricated within a build-up package. In certain such embodiments, a first (i.e., a bottom-side) field shielding material extends over an area of the build-up and is disposed facing one side of the magnet that is opposite of at least one released member of the MEMS device (i.e., the magnet is at a z-position between the MEMS device and the bottom-side shielding). In further embodiments, the released MEMS member is disposed at a z-position between the magnet and a second (ie., top-side) shielding material that also extends over an area of the build-up (i.e., the top-side shielding material is disposed facing a second side of the magnet, opposite the first side).

Figure 2:
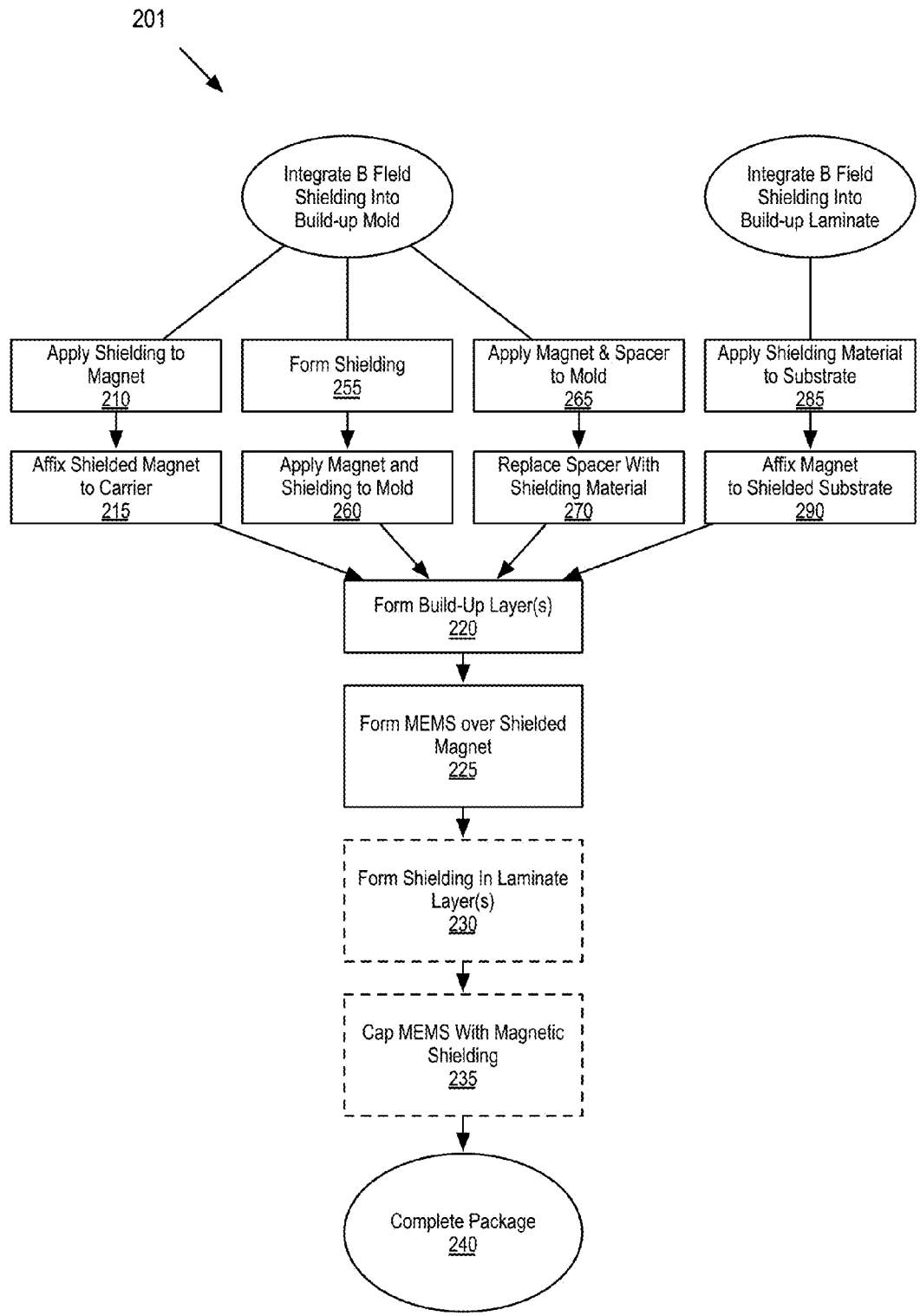
FIG. 2 is a flow diagram illustrating methods of integrating magnetic field shielding into a build-up package, in accordance with exemplary embodiments.

FIG. 2 is a flow diagram further illustrating embodiments where magnetic field shielding is integrated into a device package build-up. One or more of the embodiments of methods 201 described in the context of FIG. 2 may be utilized in the performance of FIG. 1B. Methods 201 include embodiments where field shielding is integrated into a mold for a build-up casting. FIGS. 4A-4J further illustrate one such embodiment where field shielding is integrated with the magnet and the shielded magnet is incorporated into the package mold. FIGS. 5A-5J and FIGS. 6A-6K further illustrate other field shielding mold embodiments. Methods 201 also include embodiments where field shielding is integrated into one or more laminated build-up layer, for example as further illustrated in FIGS. 7A-7L. While each of these embodiments illustrates particular structures and techniques, it is noted that the embodiments may be combined where their respective attributes are not exclusive. For example, a shielded magnet used to mold a portion of a package build up may be combined with shield material integrated into a laminated a build-up material. Furthermore, while FIGS. 4A-4J, 5A-5J, 6A-6K, and 7A-7L illustrate views of build-up structures with magnetic field shielding in accordance with a vertically integrated magnetic MEMS embodiment, it is noted that the various shielding techniques and structures so described may be readily adapted to MEMS devices having large laterally spacing from a magnet, as well as to embodiments without a MEMS device.

Referring to FIG. 2, a first shielding method begins with applying a shielding material (e.g., a high permeability foil) to a magnet at operation 210. As further illustrated in FIG. 4A, the magnet may be a permanent magnet 409 having poles oriented parallel to the z-dimension, may be a permanent magnet 409 having poles oriented parallel to the x-dimension, or may be a permanent magnet having poles with some orientation intermediate to those of magnets 409 and 409. The magnet may have nearly any dimension, but in exemplary embodiments the z-height (thickness) of magnet 409 (or magnet 409) is between 100 µm and 500 µm, and advantageously less than 300 µm. In one such embodiment, magnet 409 is cylindrical with a radius of 0.5-1 mm. In another exemplary embodiment, magnet 409 is rectangular with a side length of 1-2 mm. In other embodiments, a magnet with poles oriented parallel to the z-dimension is rectangular and a magnet with poles parallel to the x-dimension is cylindrical.

Figure 4A:
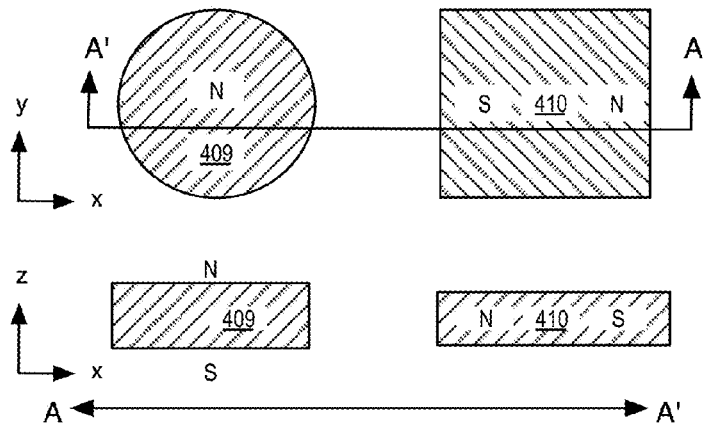
Figure 4B:
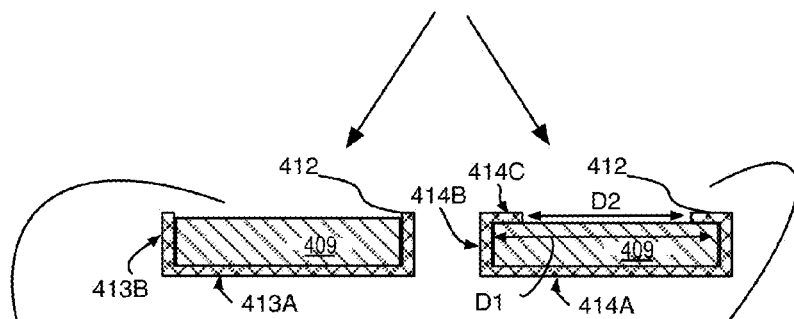
Figure 4C:
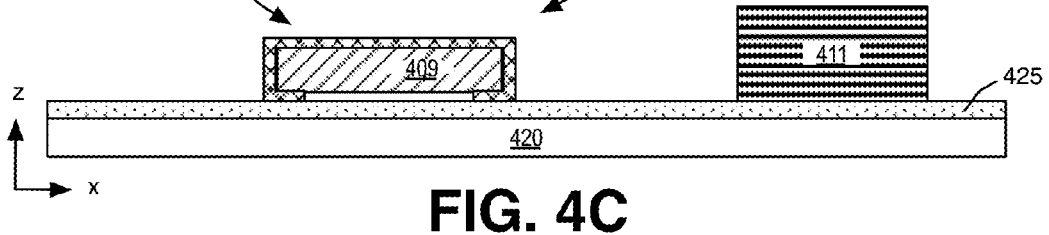

FIG. 4B further illustrates partial wrapping of magnet 409 in shielding material 412. Shielding material 412 has a high relative permeability as described above and may, for example, be any of the particular materials described above having one of many standard foil thicknesses available commercially. Shielding material 412 may cover all but one side of magnet 409, leave more than one side of the magnet exposed, and/or may cover some portion of every side of the magnet. FIG. 4B illustrates two exemplary embodiments. In a first embodiment, shielding material 412 is disposed only over lateral magnet sidewall surfaces 413B and one additional surface 413A. In another embodiment, shielding material 412 completely covers a first magnet surface 414A, completely covers lateral sidewall surfaces 414B, and partially covers remaining magnet surface 414C. In this embodiment, application of shielding material 412 forms a directional aperture having a diameter D2 that is less than a lateral dimension D1 of magnet 409. This aperture may be directed at a particular region within the package, for example toward a MEMS device, and further restrict fringing fields from other regions of the package. In other embodiments (not depicted), the center point of the shielding aperture may be offset from a center of the MEMS device.

Returning to FIG. 2, the shielded magnet is affixed to a carrier at operation 215. A pick-and-place machine may be utilized for such an operation, for example. In the exemplary embodiment further depicted in FIG. 4C, magnet 409 is affixed to carrier 420 by an adhesive foil or film 425. In the exemplary embodiment, carrier 420 is sacrificial (i.e., not retained as part of the build-up package) with magnet 409 affixed so that the exposed (top) magnet surface 414C faces carrier 420. As further illustrated in FIG. 4C, device 411 is also affixed to a region of carrier 420 spaced laterally from magnet 409. Device 411 may be any device(s) amenable to build-up package technology, such as, but not limited to an IC.

In the exemplary embodiment depicted in FIG. 4D, dielectric material 430 is molded over magnet 409 and over device 411. Dielectric material 430 may, for example, be introduced wet and then dried/cured into a build-up casting. Many suitable dielectric materials exist and embodiments are not limited in this respect. As shown in FIG. 4D, the molding process accommodates various z-heights of magnet 409 and device 411. In one embodiment where magnet 409 has a thickness of less than 200 µm and shielding material 412 has a thickness less than 6 mil, device 411 is a silicon die or a stack of such dies, with each die having a thickness of approximately over 200 micrometers (µm). In another example, device 411 has a thickness less than 150 µm such as 50 µm to 150 µm. Other thicknesses are possible. As shown, shielding material 412 entails a bottom-side field shielding material extending over an area of the build-up and disposed between a first side (surface 413A) of magnet 409 and dielectric material 430. Shielding material 412 further entails a lateral field shielding material extending in a direction non-parallel to (e.g., substantially orthogonal to) the bottom-side shielding material and is disposed between a sidewall (surface 413B) of magnet 409 and dielectric material 430. For embodiments where shielding material 412 forms a top-side aperture smaller than the area of magnet 409, the lateral shielding material wraps around a third (top-side) of magnet 409. In exemplary embodiments, dielectric material 430 is in direct contact with shielding material 412, and magnet 409 is separated from dielectric material 430 only by shielding material 412. With magnet 409 and device 411 embedded in dielectric material 430 as shown in FIG. 4E, carrier 420 and adhesive film 425 are removed, exposing the incompletely shielded top magnet surface 414C and contact pads on device 411.

Referring again to FIG. 2, additional build-up layers may be formed at operation 220 and a MEMS device formed within those build-up layers at operation 225. As illustrated in FIG. 4F, for example, dielectric layer 441 is introduced over (e.g., in direct contact with) the top magnet surface 414C and device 411. One suitable dielectric material is an ABF material introduced, for example, as a dry film laminate. FIG. 4G further depicted conductors formed in vias through dielectric material layer 441. A mechanical, laser, or other drilling process may form the vias. The conductive material in FIG. 4G includes patterned conductive MEMS member 450, MEMS barrier 455, and device pad interconnect 460 as a first conductive material level of the package build-up. Conductive material in the vias and patterned conductive lines may be formed using an electroless seed layer followed by a dry film resist (DFR) patterning and plating. The DFR may then be stripped followed by a flash etch to remove any electroless seed layer. MEMS member 450 may include a conductive anchor (not depicted as being out of the plane represented in FIG. 4G). MEMS member 450 may be any beam, coil, or other structure having suitable behavior in the presence of a field of magnet 409.

Figure 4H:
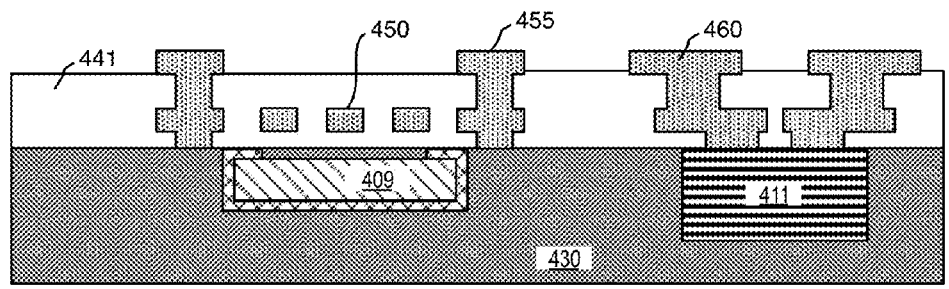

The dielectric laminate and conductor plating processes may be repeated forming the plurality of alternating dielectric and a conductive material layers of the build-up. FIG. 4H further shows additional patterned conductive lines formed as a second conductive material level over the first conductive level. The additional conductive levels of MEMS barrier 455 and device pad interconnect 460 are formed in an additional dielectric material layer 441, such as an ABF film.

Figure 4I:
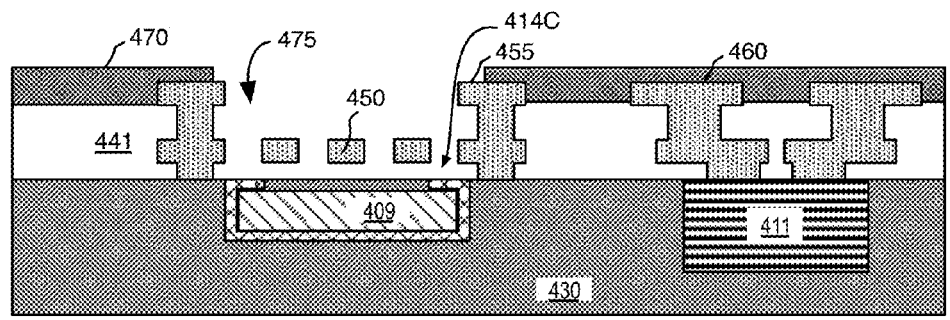
Figure 4J:
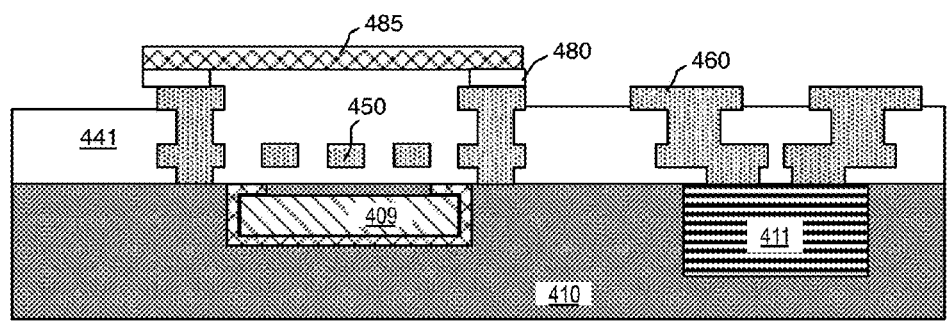

According to one embodiment, a void is designated in a volume or three-dimensional space in an area of the build-up disposed over a magnet. It is appreciated that in the formation of a build-up package, conductive lines and vias are positioned in predetermined locations within the package. Because such locations are predetermined, voids may be designed. FIG. 4I shows the structure of FIG. 4H following the introduction and patterning of a mask 470, which may be for example, a dry film resist (DFR) material patterned to have an opening 475 over the MEMS member 450. FIG. 4I also shows the removal of dielectric layer(s) 441 around MEMS member 450, thereby releasing member 450 from all surrounding material except for one or more anchor points. Member 450 is then free to experience a displacement in at least one of the z-dimension, x-dimension, or y-dimension. One way the dielectric material may be removed is by plasma etching (e.g., oxygen ash). A release etch stop layer or a compositional difference between dielectric layer 430 and 441 may result in different etch characteristics that set the vertical depth of the release etch, lateral confinement of the release etch may be limited by patterned conductive material layers, such as MEMS barrier 455. As further depicted in FIG. 4I, MEMS member 450 is vertically aligned to be disposed over/within the magnetic field shielding aperture.

Returning to FIG. 2, in addition to applying magnetic field shielding to the magnet, shielding may be provided within laminate layers at operation 230, and/or the MEMS device is capped with a "top-side" magnetic shielding at operation 235. With at least the bottom-side shielding present, operations 230 and 235 are optional, as denoted by dashed boxes in FIG. 2. Shielding within laminate layers formed at operation 230 is to further restrict magnetic field lines, for example as described above in the context of FIG. 3C, and is discussed below in the context of another exemplary embodiment. Top-side shielding formed at operation 235 is to constrain or restrict magnetic field lines beyond the top-side shielding, for example as described above in the context of FIG. 3B. In the exemplary embodiment shown in FIG. 4J, mask 470 is removed and a top-side magnetic shield 485 is disposed over MEMS member 450 on a side of magnet 409 opposite magnetic shielding material 412. Top-side shield 485 may be affixed to a patterned conductive material layer of the package build-up. In the illustrated embodiment, top-side shield 485 is affixed to a top surface of MEMS barrier 455. Top-side shield 485 may be a dry laminate film (foil) or coupon of any of the high permeability materials described above for shielding material 412, or may be composite stack including a layer of a high permeability material. Such a stack may be affixed with conventional pick-and-place equipment/techniques. A joint material 480 (e.g., adhesive, solder, or the like) may affixed shielding material 485 to a patterned conductive layer surface. The first exemplary embodiment of methods 201 then ends at operation 240 (FIG. 2) where the magnetically shielded package build-up is completed following any conventional build-up packaging techniques.

Referring back to FIG. 2, in a second field shielding mold embodiment, a shielding material is preformed into a structure independent of the magnet at operation 255. The shielding structure and the magnet then form separate portions of a mold at operation 260. In the exemplary embodiment depicted in FIGS. 5A and 5B, shielding material is formed into a guard ring 512 having lateral dimensions that follow a lateral sidewall of the magnet 409. For example, where magnet 409 is a 1.5 mm on a side, an inner diameter of guard ring 512 is larger than 1.5 mm on a side to accommodate magnet 409. In the exemplary embodiment, guard ring 512 is a closed structure, forming a continuous perimeter surrounding sidewalls of magnet 401. Unlike a direct application of shielding to magnet 409 as previously described, guard ring 512 does not overlap the build-up footprint of magnet 409. Guard ring 512 may have a z-height sufficient to provide desired lateral magnetic field confinement, and/or to provide adequate structural rigidity to permit mounting, for example with a pick-n-place technique, and/or to otherwise accommodate the mold process. In the exemplary embodiment, guard ring 512 has a z-thickness greater than that of magnet 409, such as 300-500 micron. Guard ring 512 may be stamped from a sheet good having high relative permeability, for example having a relative permeability in the ranges described above. Guard ring 512 may be a homogeneous material (e.g., Mu-metal), or it may be a laminate or composite structure with one or more layers of high relative permeability.

Figure 5A:
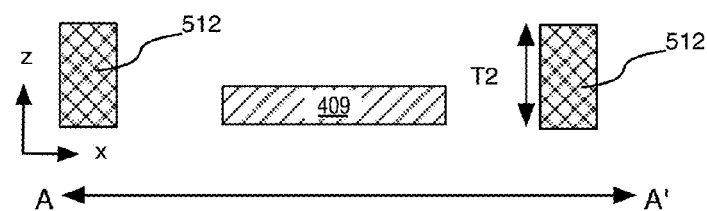
Figure 5B:
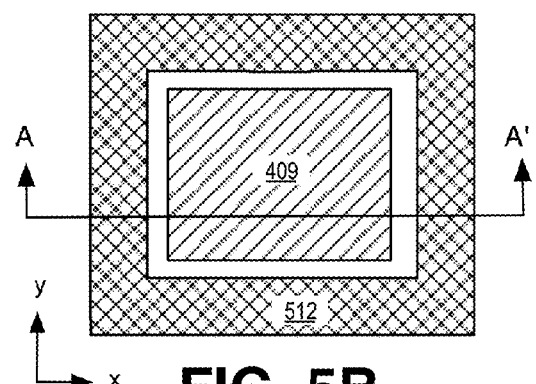
Figure 5C:
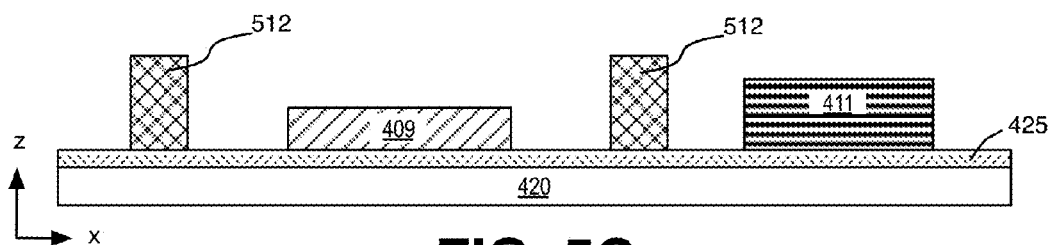

As shown in FIG. 5C, magnet 409 and device 411 are affixed to carrier 420, again with adhesive layer 425 for example, substantially as was described above in the context of FIG. 4C. Additionally, guard ring 512 is similarly affixed to carrier 420, for example using the same pick-and-place techniques utilized to mount magnet 409 and device 411.

The structure in FIG. 5C functions as at least part of a mold, with dielectric material 430 then formed thereon (e.g., dispensed and cured/etc.) so as to embed magnet 409, device 411, and guard ring 512 in dielectric material 430. In the exemplary embodiment shown, three sides of magnet 409 are embedded in dielectric material 430 with some dielectric material 430 disposed between guard ring 512 and sidewalls of magnet 409. Dielectric material 430 is further disposed between guard ring 512 and device 411. As such, magnetic field lines extending laterally from magnet 409 will be significantly reduced in the build-up region occupied by device 411.

As further shown in FIG. 5D, magnetic shielding material 514 is disposed over dielectric 430. For the exemplary embodiment where guard ring 512 is not completely embedded within dielectric material 430, shielding material 514 may be in direct contact with guard ring 512. Dielectric material 430 is however disposed between the magnet and field shielding material 514. Shielding material 514 may be of any desired thickness and in one advantageous embodiment, shielding material 514 is formed by sputtering Mu-metal, or another material having suitably high permeability. Other deposition techniques may also be used (e.g., electroless plating, lamination etc.). As shown in FIG. 5E, carrier 420 (and adhesive 425) is removed and the build-up inverted such that shielding material 514 becomes a bottom-side shielding material with a top-side of magnet 409 and pads of device 411 exposed.

Figure 5H:
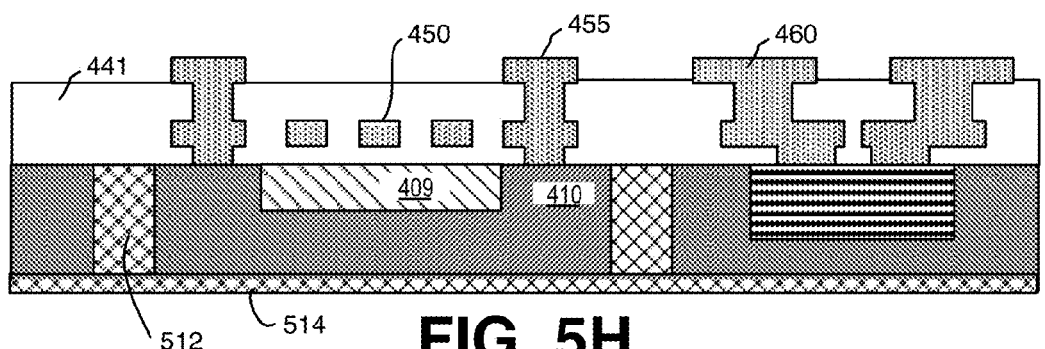

Referring back to FIG. 2, additional build-up layers may again be formed at operation 220 and a MEMS device then formed within those build-up layers at operation 225. As illustrated in FIG. 5F for example, dielectric layer 441 is introduced over (e.g., in direct contact with) the top-side magnet surface 414C and device 411, and over guard ring 512. One suitable dielectric material is an ABF material introduced, for example, as a dry film laminate as previously described in context of FIG. 4F. FIG. 5G further depicts conductors formed in vias through dielectric material layer 441. The conductive material in FIG. 4G again includes patterned conductive MEMS member 450, MEMS barrier 455, and device pad interconnect 460 as a first conductive material level of the package build-up. The dielectric laminate and conductor plating processes may be repeated forming the plurality of alternating dielectric and conductive material layers of the build-up. FIG. 5H further shows additional patterned conductive lines formed as a second conductive material level over the first conductive level.

Figure 5I:
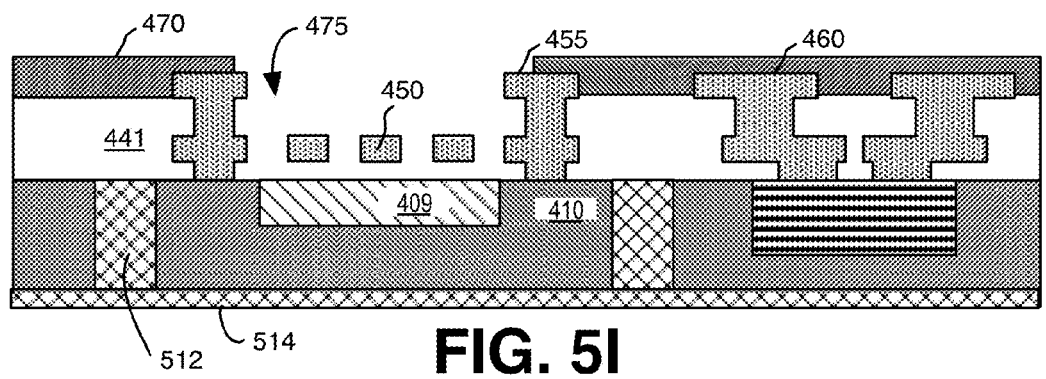

FIG. 5I shows the structure of FIG. 5H following the introduction and patterning of a mask 470. FIG. 5I also shows the removal of dielectric layer(s) 441 around MEMS member 450, thereby releasing member 450 from all surrounding material except for one or more anchor points. Member 450 is therefore free to experience a displacement in at least one of the z-dimension, x-dimension, or y-dimension.

Figure 5J:
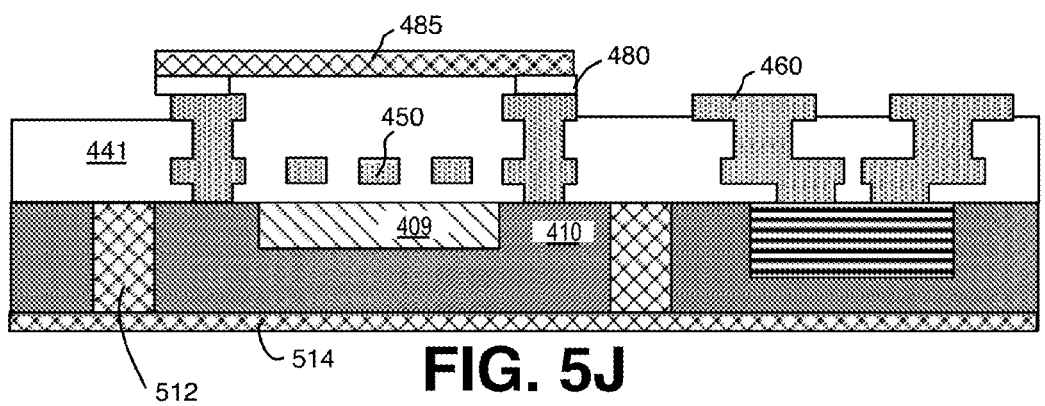

As shown in FIG. 5J, mask 470 is removed and top-side magnetic shield 485 is disposed over MEMS member 450 on a side of magnet 409 opposite bottom magnetic shielding material 514. Top-side shield 485 may be affixed to a patterned conductive material layer of the package build-up, for example by solder. Top-side shield 485 may be any of those materials previously described in the context of FIG. 4J. The second exemplary embodiment of methods 201 then ends at operation 240 (FIG. 2) where the magnetically shielded package build-up is completed following any conventional techniques, such as adding a solder mask or top layer over the build up.

Referring back to FIG. 2, in a third field shielding mold embodiment, a spacer and a magnet are incorporated into a mold at operation 265, and the spacer is removed to form a void in a dielectric casting. Shielding material is then deposited into the void to replace the spacer at operation 270. As such, the spacer functions as a fabrication mandrel used to define the geometry of at least a portion of shielding material incorporated into the build-up. Similar to the second molding embodiment described above, the resulting shielding is independent of the magnet with the mandrel and the magnet forming separate portions of a mold at operation 265.

Figure 6A:
FIGS. 6A, 6B, 6C, 6D, 6E, 6F, 6G, 6H, 6I, 6J, 6K, and 6L illustrate views of a packaging build-up structure with magnetic field shielding as a packaging build-up method is performed in accordance with an embodiment.
Figure 6B:
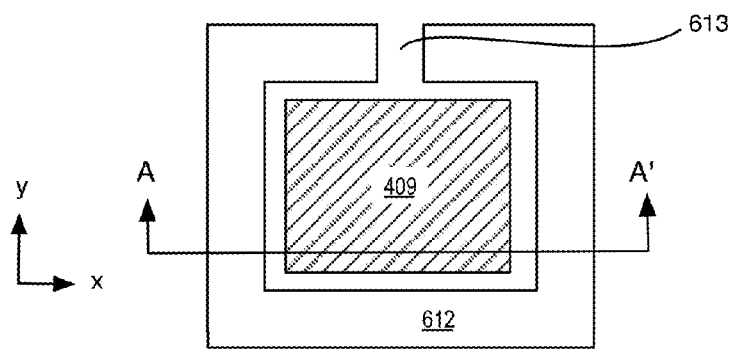

Generally, a mandrel may be preformed into any suitable structure, and may be stamped from a sheet good, for example. The mandrel should be of a material selectively removable from a build-up dielectric material, for example by dissolution or by physical extraction. In the exemplary embodiment depicted in FIGS. 6A and 6B, mandrel 612 has lateral dimensions to follow a lateral sidewall of the magnet 409. For example, where magnet 409 is a 1.5 mm on a side, an inner diameter of mandrel 612 is larger than 1.5 mm on a side to accommodate magnet 409. As shown in FIG. 6B, mandrel 612 is not a closed structure and instead includes an opening 613 so as to avoid a complete loss of continuity between magnet 409 and the build-up upon removal of mandrel 612. Mandrel 612 may have a z-height sufficient to provide a void suitable for a desired lateral magnetic field confinement, and/or to have adequate structural rigidity to permit mounting, for example with a pick-n-place technique, and/or to accommodate the mandrel's removal after the mold process. In the exemplary embodiment, mandrel 612 has a z-thickness greater than that of magnet 409, such as 300-500 micron, or more.

Figure 6C:
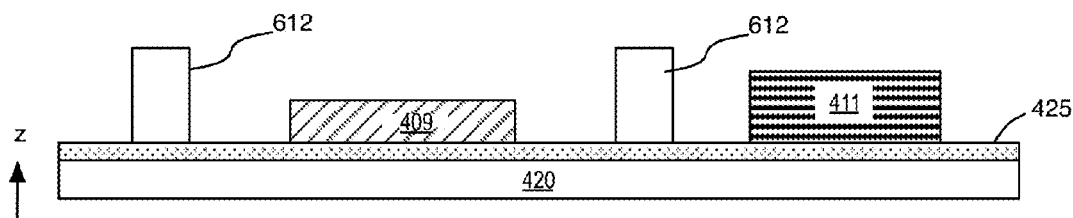
Figure 6D:
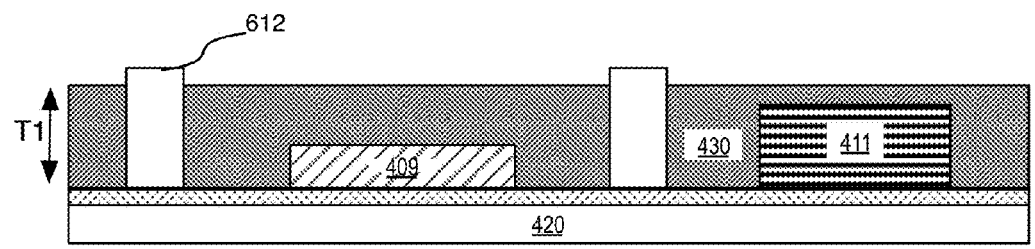

As shown in FIG. 6C, magnet 409 and device 411 are affixed to carrier 420, again with adhesive layer 425 for example, substantially as was described above in the context of FIG. 4C. Additionally, mandrel 612 is similarly affixed to carrier 420, for example using the same pick-and-place techniques utilized to mount magnet 409 and device 411.

The structure in FIG. 6C then functions as at least part of a mold, with dielectric material 430 then formed (e.g., dispensed and cured/etc.) so as to embed magnet 409, device 411, and mandrel 612. In the exemplary embodiment shown in FIG. 6D, three sides of magnet 409 are embedded in dielectric material 430 with some dielectric material 430 disposed between mandrel 612 and sidewalls of magnet 409. Dielectric material 430 is further disposed between mandrel 612 and device 411. At least a portion of mandrel 612 remains exposed after application of dielectric material 430 facilitating its removal as illustrated in FIG. 6E.

Figure 6E:
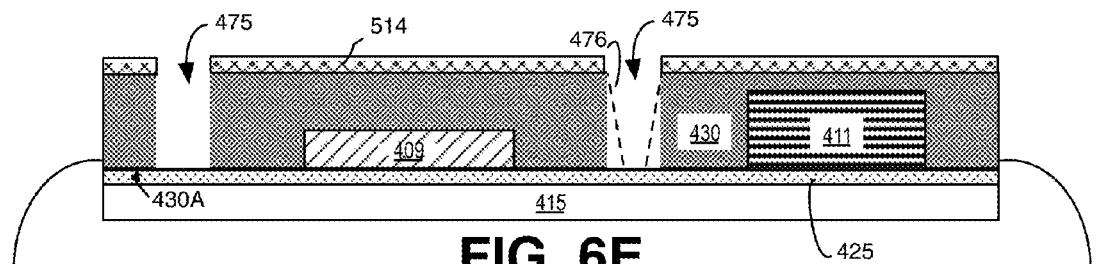
Figure 6F:
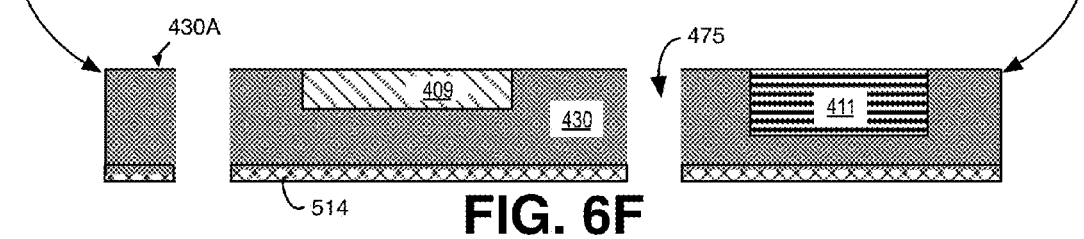

In FIG. 6E, magnetic shielding material 514 is disposed over dielectric 430. Dielectric material 430 is disposed between the magnet and field shielding material 514. Shielding material 514 may be of any desired thickness and in one advantageous embodiment, shielding material 514 is sputter deposited. Other deposition techniques may also be used (e.g., electroless plating, lamination etc.). Shielding material 514 may be Mu-metal, or another material having suitably high permeability. As shown in FIG. 6F, carrier 420 (and adhesive 425) is removed and the build-up inverted such that shielding material 514 becomes a bottom-side shielding material with a top-side of magnet 409 and pads of device 411 exposed.

As shown in FIG. 6E removal of mandrel 612 forms a void 475 extending through the entire thickness of dielectric material 430. Depending on the removal process void 475 may have sidewall indicative of mandrel removal. For example, sidewalls of mandrel 612 may be positively sloped to facilitate extraction. As such, sidewalls of void 475 may be non-orthogonal to top and/or bottom surfaces of dielectric 430 and/or sides of magnet 409, as illustrated by dashed lines 476 in FIG. 6E.

Figure 6G:
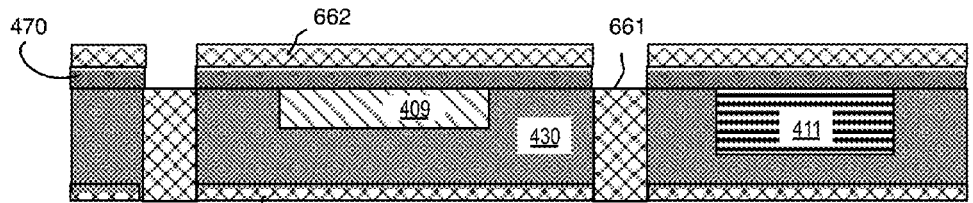

Magnetic shielding material 514 disposed over dielectric 430 may be formed before or after removal of mandrel 612. FIG. 6G further illustrates an embodiment where shielding material 514 is formed before removal of mandrel 612. Mask 470 is formed after mandrel removal and is patterned to open void 475, which is then filled, at least partially (e.g., lined) with a shielding material 661 of suitably high permeability (e.g., any of those described above). Shielding material 661 may be of a same or different composition as bottom-side shielding material 514. Even where shielding material 661 may be of the same material as shielding material 514, microstructure of the two films may be indicative of the fabrication process. For example, anisotropic grain orientation may show a bias or texture indicative of lateral sidewall growth (e.g., columnar grains extending from sidewall) in shielding material 661, while texture in shielding material 514 is indicative of vertical growth (e.g. columnar grains extending from the top surface of dielectric 430). Thus in addition to slope over shielding material 661 (e.g., following sidewall 476), microstructure may demark interfaces delineated in FIG. 6G with solid lines. Following deposition of shielding material 661, mask 470 is stripped to re-expose a top-side of magnet 409 and device 411.

Alternatively, shielding material 661 is deposited at the same time as shielding material 514 (e.g., deposited in the state depicted in FIG. 6E). For this embodiment, no mask 470 is needed and the two deposition operations depicted in FIGS. 6E and 6G are combined with the via filling occurring from an opposite side of the build-up. Such a deposition may be performed before or after carrier 420 is removed.

Figure 6H:
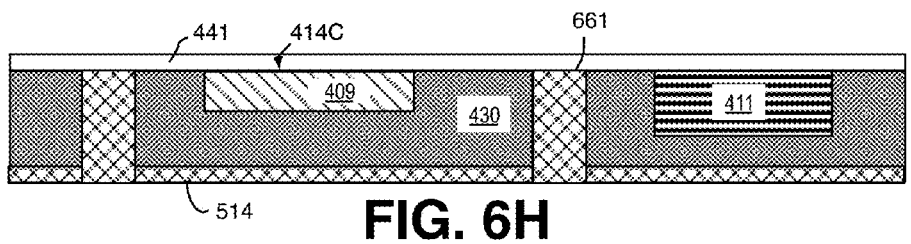
Figure 6I:
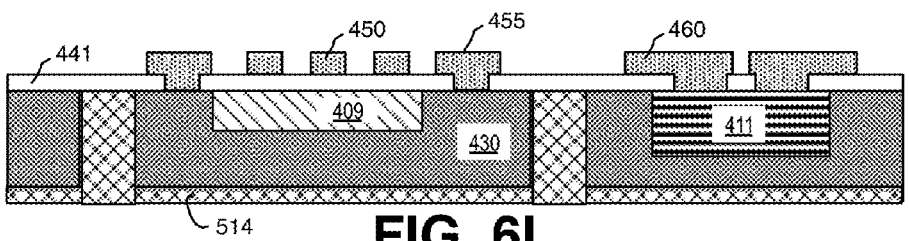
Figure 6J:
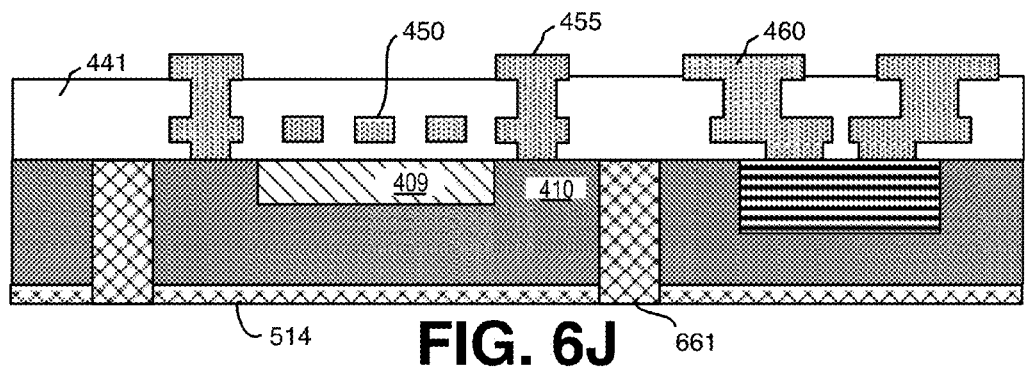

Referring back to FIG. 2, with both lateral and bottom-side magnetic shielding in place, additional build-up layers may again be formed at operation 220 and a MEMS device then formed within those build-up layers at operation 225. As illustrated in FIG. 6H, for example, dielectric layer 441 is introduced over (e.g., in direct contact with) the top-side magnet surface 414C and device 411, and over magnetic shield 661. One suitable dielectric material is an ABF material introduced, for example, as a dry film laminate as previously described in context of FIG. 4F. FIG. 6I further depicts conductors formed in vias through dielectric material layer 441. The conductive material in FIG. 6I again includes patterned conductive MEMS member 450, MEMS barrier 455, and device pad interconnect 460 as a first conductive material level of the package build-up. The dielectric laminate and conductor plating processes may be repeated forming the plurality of alternating dielectric and conductive material layers of the build-up. FIG. 6J further shows additional patterned conductive lines formed as a second conductive material level over the first conductive level.

Figure 6K:
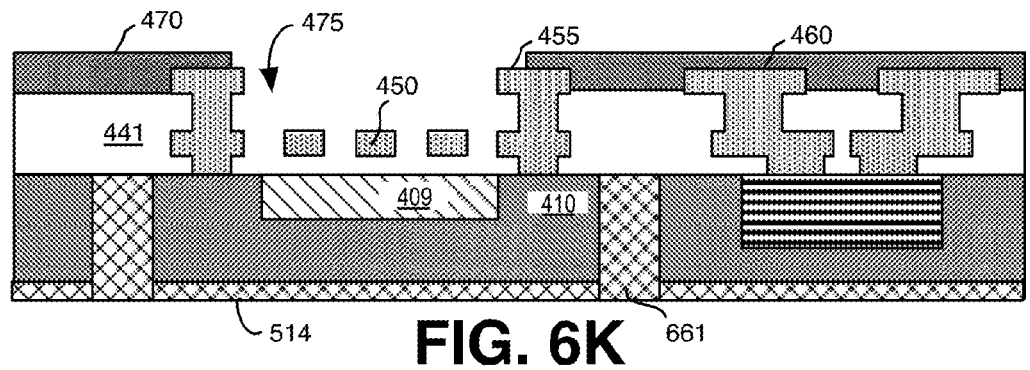

FIG. 6K shows the structure of FIG. 6J following the introduction and patterning of a mask 470. FIG. 6K also shows the removal of dielectric layer(s) 441 around MEMS member 450, thereby releasing member 450 from all surrounding material except for one or more anchor points. Member 450 is then free to experience a displacement in at least one of the z-dimension, x-dimension, or y-dimension.

Figure 6L:
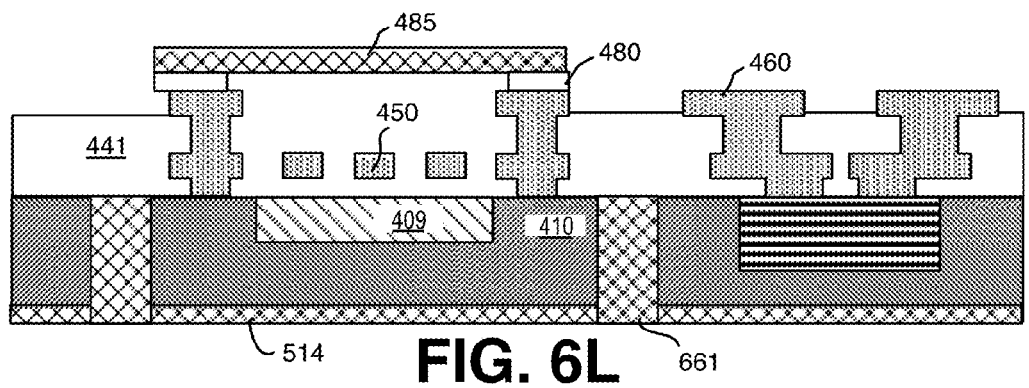

As shown in FIG. 6L, mask 470 is removed and top-side magnetic shield 485 is disposed over MEMS member 450 on a side of magnet 409 opposite bottom magnetic shielding material 514. Top-side shield 485 may be affixed to a patterned conductive material layer of the package build-up, for example by solder. Top-side shield 485 may be any of those materials previously described in the context of FIG. 4J. The third exemplary embodiment of methods 201 then ends at operation 240 (FIG. 2) where the magnetically shielded package build-up is completed following any conventional techniques, such as adding a solder mask or top layer over the build up.

Figure 7A:
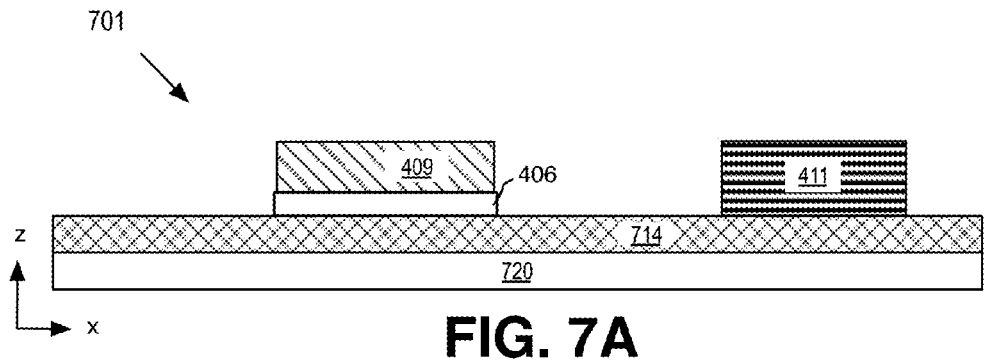
FIGS. 7A, 7B, 7C, 7D, 7E, 7F, 7G, 7H, 7I, 7J, 7K, and 7L illustrate views of a packaging build-up structure with magnetic field shielding as a packaging build-up method is performed in accordance with an embodiment.

Referring back to FIG. 2, in another embodiment, magnetic field shielding is integrated into a build-up laminate. Such an embodiment may be exclusive of other shielding integrated into molded build-up materials, or employed in addition to such shielding materials. As shown in FIG. 2, shielding material is applied to a substrate at operation 285 and a magnet is affixed to the shielded substrate at operation 290. Application may be global over the entire substrate or the shielding material may be selectively applied to only certain regions of the substrate. FIG. 7A further depicts an exemplary bottom-side magnetic shielding material 714 disposed onto substrate 720. Shielding material 714 may be any material with suitably high permeability, such as, but not limited to, Mu-metal, permalloy, or another material having a relative permeability in the ranges described above. Substrate 720 may be any packaging substrate suitable as a build-up carrier and/or substrate 720 may be one or more organic dielectric laminate (e.g., ABF). Shielding material 714 may be deposited by a variety of techniques onto substrate 720, such as, but not limited to sputter or dry film lamination. Magnet 409 and device 411 are then affixed over the shielded substrate, for example with adhesive 406.

Figure 7B:
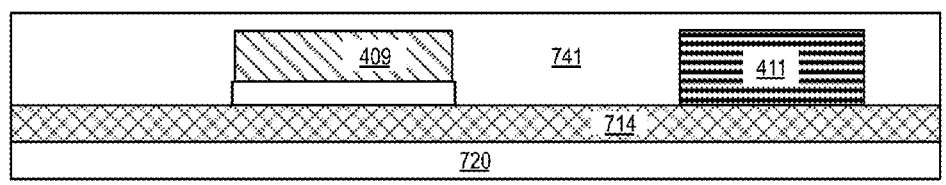

FIG. 7B illustrates lamination of a photodefinable dielectric (insulator) layer 741. Dielectric layer 741 may be any conventional photodefinable (organic) dielectric layer. Because dielectric layer 741 is laminated after magnet 409 is affixed to bottom-side field shielding material 714, magnet 409 only occupies a portion of the area of the build-up covered by shielding material 714. Also, dielectric material 741 is present adjacent to sidewalls of magnet 409, but is absent from a region between magnet 409 field shielding material 714.

Figure 7C:
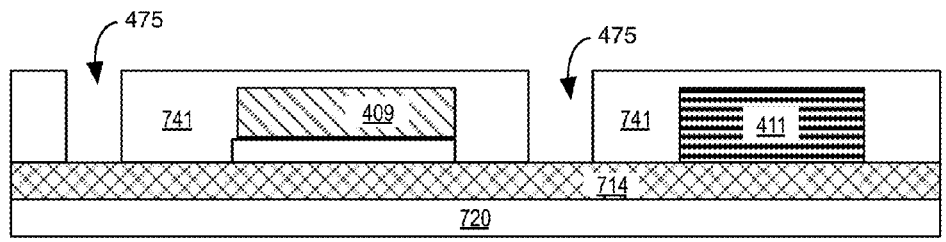

As shown in FIG. 7C photodefinable dielectric layer 741 is patterned, for example with any conventional mask, exposure, develop process suitable for the particular dielectric insulator. Patterning of dielectric layer 741 forms one or more voids 475. A void 475 may either be a continuous perimeter mote surrounding magnet 409, similar to that described in the context of FIG. 6E, or may be one of a plurality of individual via structures, each of which pass through the thickness of dielectric layer 741 to expose shielding material 714.

Figure 7D:
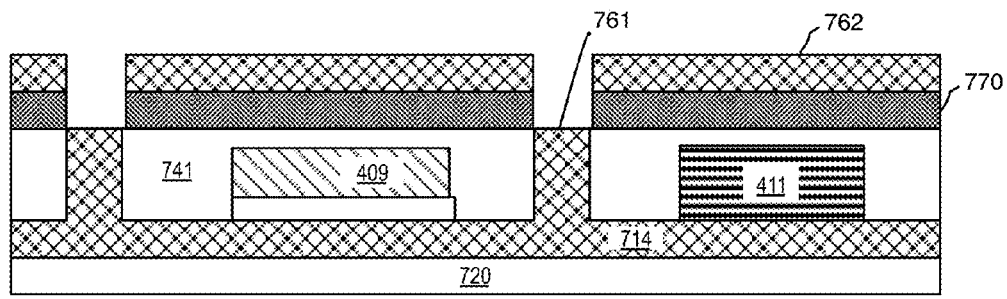

As shown in FIG. 7D, a mask 740 is formed over patterned dielectric layer 714 and shielding material layer 762 formed over mask 740 and into voids 475. Voids 475 are at least partially filled with a lateral shielding material 761. Shielding materials 761, 762 may have the same composition, or a different composition, as bottom shielding material 714. Shielding material 761 may be any material high relative permeability (e.g., Mu-metal, etc.).

Figure 7E:
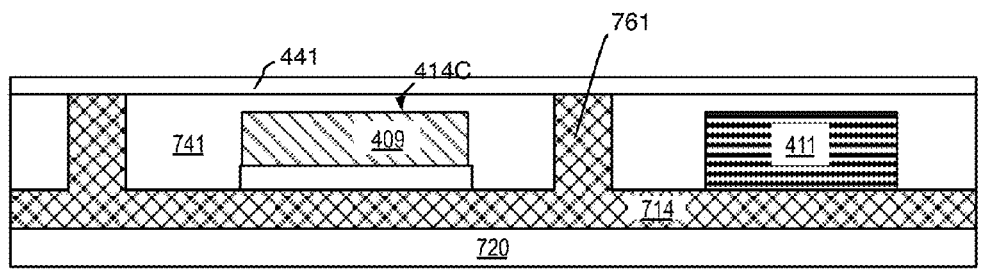
Figure 7F:
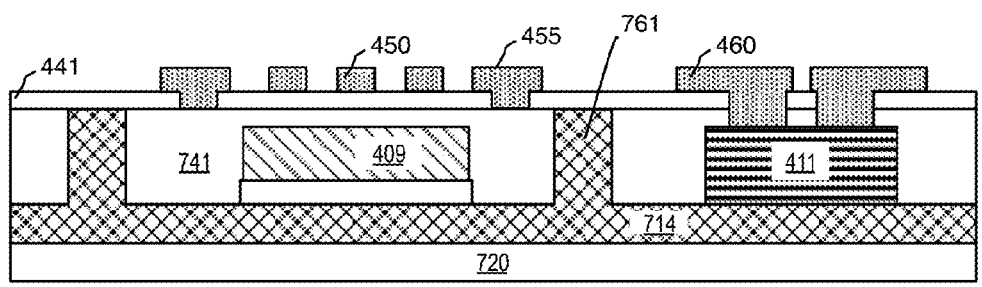
Figure 7G:
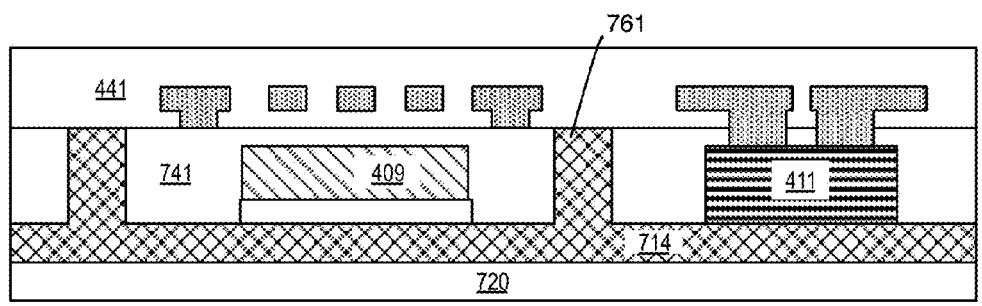
Figure 7H:
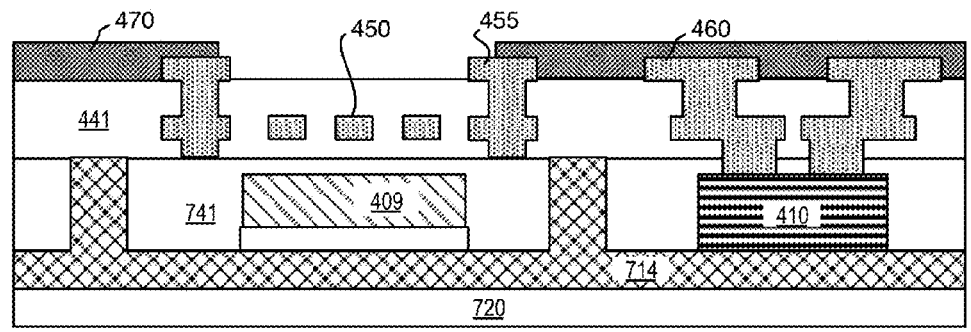

Referring again to FIG. 2, with both lateral and bottom-side magnetic shielding in place, additional build-up layers may again be formed at operation 220 and a MEMS device then formed within those build-up layers at operation 225. As illustrated in FIG. 7E, for example, dielectric layer 441 is introduced over the top-side magnet surface 414C, over device 411, and over magnetic shield 761. In the exemplary embodiment, because dielectric layer 741 is a laminate disposed over magnet 409 and device 411, magnetic shield 761 has a z-height that is greater than that of magnet 409 and device 411, or where magnet 409 and device 411 have different z-heights, a filler material may be present to planarize the two components. In advantageous embodiments however, magnet 409 and device 411 have nearly the same z-height (thickness). Dielectric layer 441 may be an ABF material introduced, for example, as a dry film laminate as previously described in context of FIG. 4F. FIG. 7F further depicts conductors formed in vias through dielectric material layer 441. The conductive material in FIG. 7F again includes patterned conductive MEMS member 450, MEMS barrier 455, and device pad interconnect 460 as a first conductive material level of the package build-up. The dielectric laminate and conductor plating processes may be repeated as illustrated in FIGS. 7G and 7H forming the plurality of alternating dielectric and conductive material layers of the build-up. FIG. 7H further shows additional patterned conductive lines formed as a second conductive material level over the first conductive level after introduction and patterning of a mask 470.

Figure 7I:
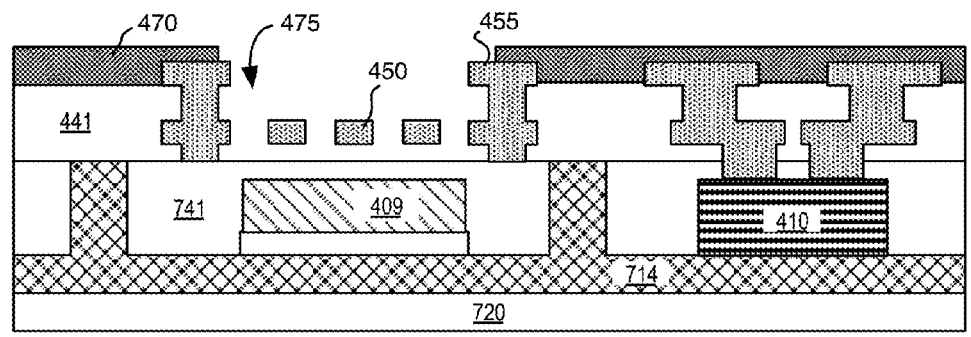

FIG. 7I shows the structure of FIG. 7H following the removal of dielectric layer(s) 441 around MEMS member 450 to form void 475 releasing member 450 from all surrounding material except for one or more anchor points.

Figure 7J:
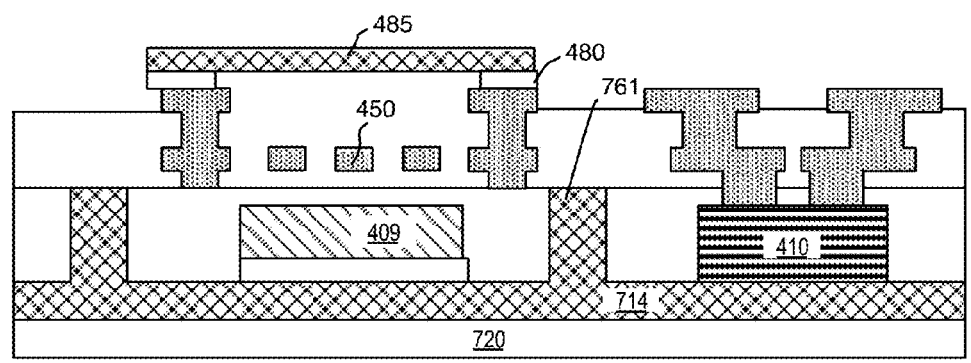

As shown in FIG. 7J, mask 470 is removed and top-side magnetic shield 485 is disposed over MEMS member 450 on a side of magnet 409 opposite bottom magnetic shielding material 714. Top-side shield 485 may be affixed to a patterned conductive material layer of the package build-up, for example by solder. Top-side shield 485 may be any of those materials previously described in the context of FIG. 4J. The third exemplary embodiment of methods 201 then ends at operation 240 (FIG. 2) where the magnetically shielded package build-up is completed following any conventional techniques, such as adding a solder mask or top layer over the build up.

Figure 7K:
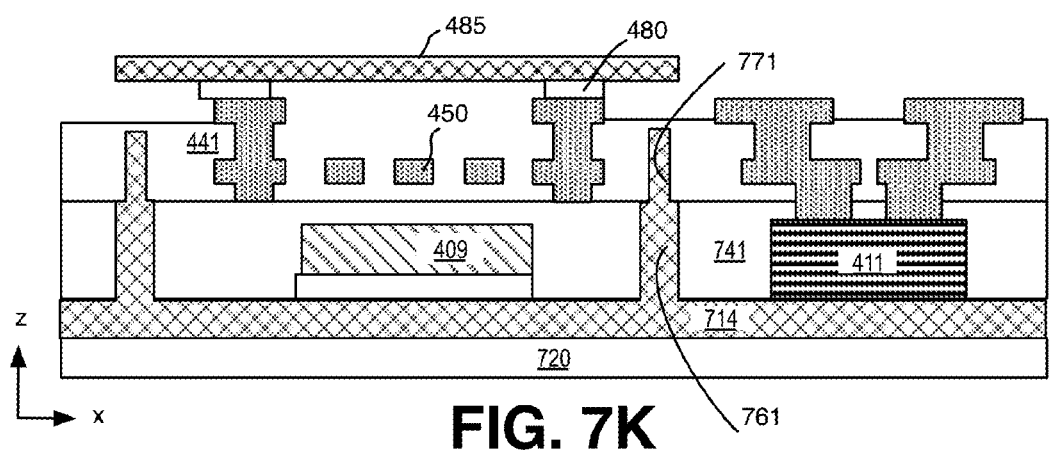
Figure 7L:
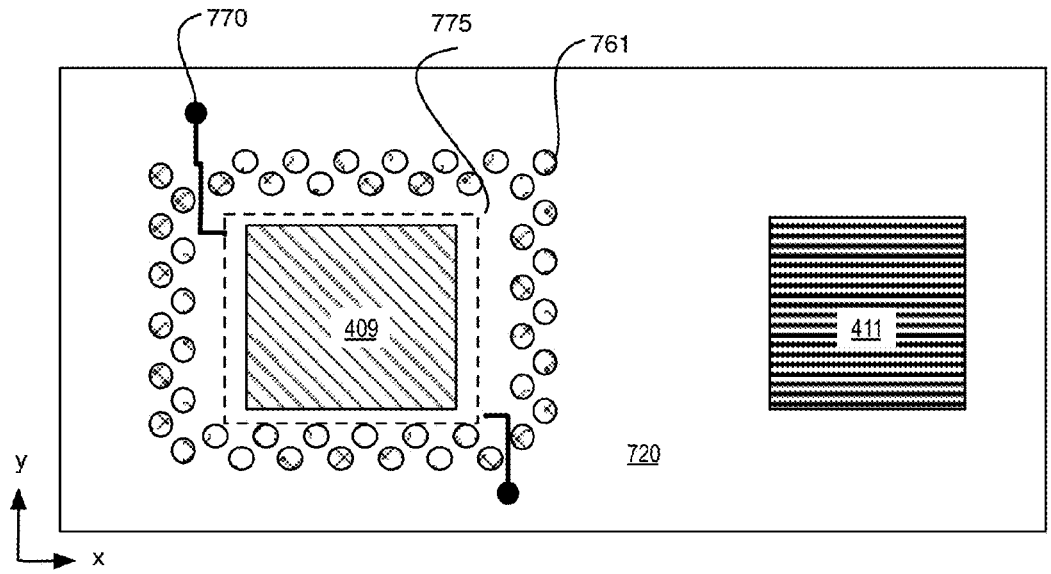

Notably, although only one via level is filled with magnetic field shielding material 761, the process so described may be repeated with each successive dielectric lamination, forming for example a stacked via filled with magnetic shielding material through the entire z-thickness of the build-up. Such a stack magnetic shielding via is illustrated in FIG. 7K. In such a shielding architecture, magnetic field shielding material 761 may extend from bottom shielding material 714 to top-side shield 485, if desired. For each successive dielectric layer lamination, two patterning and two depositions are performed with one patterning and deposition forming electrical interconnects and another patterning and deposition forming magnetic field shielding structures. FIG. 7L illustrates a plan view of one embodiment where through vias filled with magnetic field shielding material 761 are arrayed along a perimeter of magnet 409. For stacked via embodiments, electrical routing passes through some break in the shielding, for example in FIG. 7L, electrical routing 770 extends between adjacent ones of the vias to pass through the magnetic shielding to electrically coupled with MEMS device 775 that is disposed over magnet 409.

Figure 8:
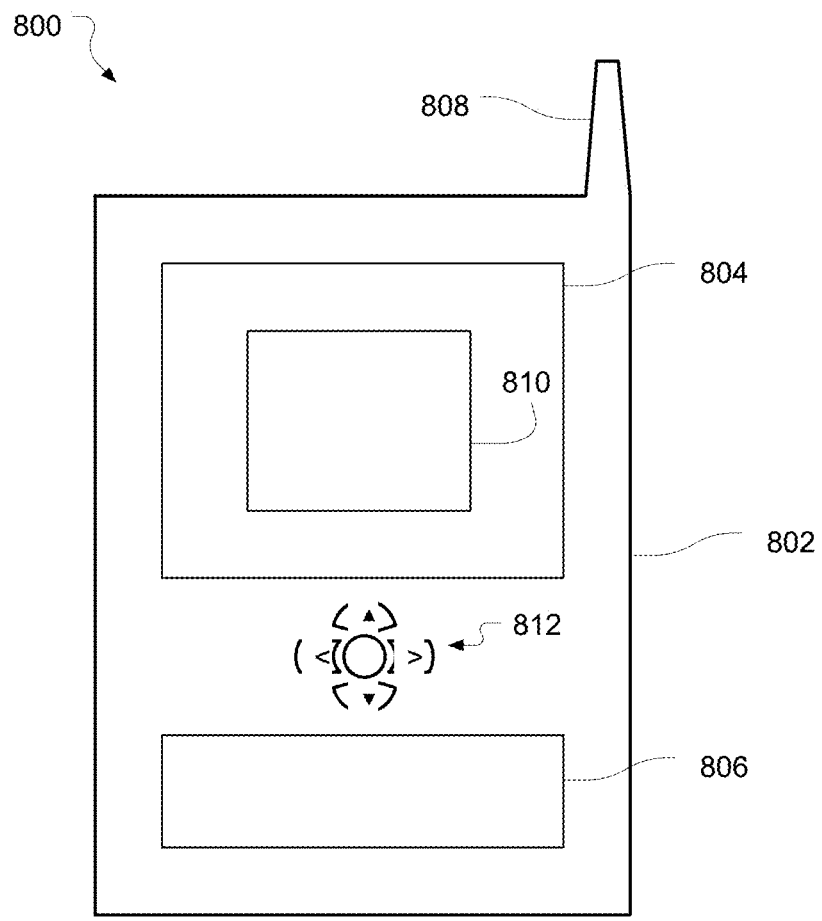
FIG. 8 is an illustrative diagram of an exemplary system employing a shielded magnetic MEMS device, arranged in accordance with an embodiment.

FIG. 8 is an illustrative diagram of an exemplary end-user device 800, in accordance with embodiments. Device 800 may include one or more magnet and magnetic field shielding structure within a package build-up. For example, in one embodiment a magnetically coupled MEMS device, a magnet, and magnetic shielding is included in the device 800. Device 800 may be a mobile device although device 800 is not limited to this context. For example, device 800 may be incorporated into a laptop computer, ultra-laptop computer, tablet, touch pad, portable computer, handheld computer, palmtop computer, cellular telephone, smart device (e.g., smart phone, smart tablet or mobile television), mobile internet device (MID), messaging device, data communication device, and so forth. Device 800 may also be an infrastructure device. For example, device 800 may be incorporated into a large format television, set-top box, desktop computer, or other home or commercial network device. As shown in FIG.

8, device 800 may include a housing 802, a display 804, an input/output (I/O) device 806, and an antenna 808. Device 800 also may include navigation features 812. Display 804 may include any suitable display unit for displaying information appropriate for a mobile computing device. I/O device 806 may include any suitable I/O device for entering information into a mobile computing device. Examples for I/O device 806 may include an alphanumeric keyboard, a numeric keypad, a touch pad, input keys, buttons, switches, microphones, speakers, voice recognition device and software, and so forth.

Figure 9:
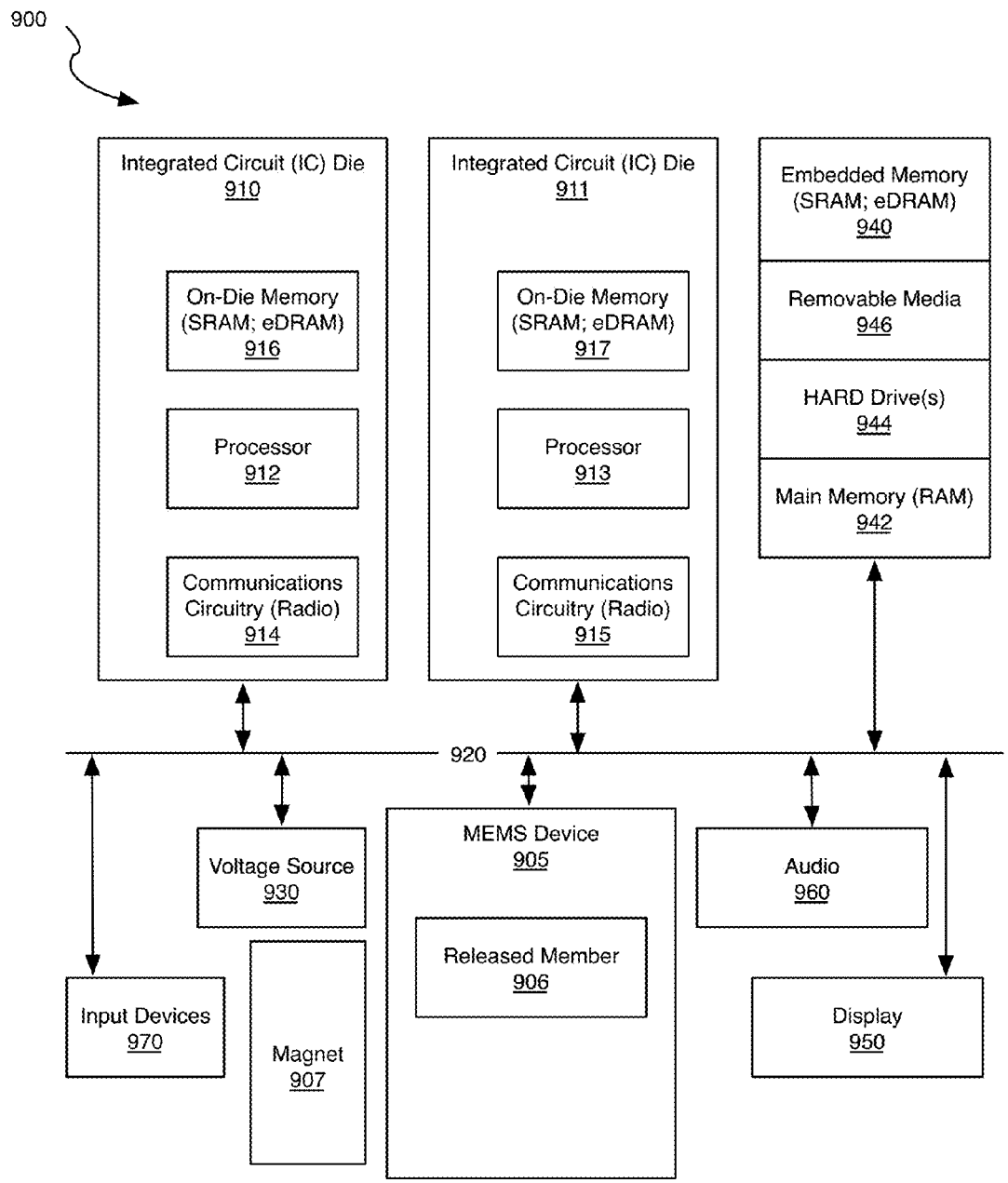
FIG. 9 is a block diagram of a system employing a shielded magnetic MEMS device, in accordance with an embodiment of the present invention.

FIG. 9 is a block diagram of a system 900 employing a shielded magnetic MEMS device, in accordance with an embodiment of the present invention. In one exemplary embodiment, system 900 is disposed within housing 802, as a component or chipset of device 800. System 900 may also be a tablet computer. System 900 may be a mobile device such as a notebook computer. System 900 may also be a desktop computer. System 900 may also be integral to an automobile. System 900 may be integral to a television. System 900 may be integral to a DVD player. System 900 may be integral to a digital camcorder. In the exemplary embodiment, system 900 is a computer system that includes a system bus 920 to electrically couple the various components of system 900. System bus 920 is a single bus or any combination of busses according to various embodiments. System 900 includes a voltage source 930 that provides power to an integrated circuit 910. In some embodiments, the voltage source 930 supplies current to integrated circuit 910 through the system bus 920. Integrated circuit 910 is electrically coupled to the system bus 920 and includes any circuit, or combination of circuits according to an embodiment. In an embodiment, integrated circuit 910 includes a processor 912. As used herein, the processor 912 may be any type of device such as, but not limited to non-equivalent embodiments of a microprocessor, a microcontroller, a graphics processor, an SoC processor with graphics capabilities, a digital signal processor, an SoC processor with RF capabilities, etc. Other types of circuits that can be included in the integrated circuit 910 are an application-specific integrated circuit (ASIC), such as a communications circuit 914 for use in non-equivalent wireless devices such as cellular telephones, smartphones, pagers, portable computers, two-way radios, and other electronic systems. In an embodiment, processor 910 includes on-die memory 916 such as static random-access memory (SRAM). In an embodiment, the processor 910 includes embedded on-die memory 916 such as embedded dynamic random-access memory (eDRAM). In an embodiment, integrated circuit 910 is complemented with a second integrated circuit 911. In an embodiment, the second integrated circuit 911 is as a graphics processor or a radio-frequency integrated circuit, or both. In an embodiment, at least one MEMS device 905 including a released member 906 is coupled to the integrated circuits 910, 911. In an embodiment, MEMS device 905 is a sensor such as an accelerometer for a tablet or smartphone. In an embodiment, at least one of MEMS device 905 voltage source 930 is operable based, at least in part, on a magnetic field provided by permanent magnet 910. Magnet 910 is further shielded by one magnetic field shielding in accordance with any build-up compatible shielding structures, such one or more of those embodiments described in detail above.

In an embodiment, system 900 includes an antenna element 982. By use of the antenna element 982, a remote device, such as a television, may be operated remotely through a wireless link. For example, an application on a smart telephone that operates through a wireless link broadcasts instructions to a television up to about 30 meters distant such as by Bluetooth® technology. In an embodiment, the remote device(s) includes a global positioning system of satellites for which the antenna element(s) are configured as receivers. In an embodiment, system 1800 also includes external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital optical disks (DVDs), flash memory drives, and other tangible media known in the art. In an embodiment, the external memory 940 is part of a POP package that is stacked upon an apparatus that includes a build up with magnetic shielding according to any disclosed embodiments.

In an embodiment, the electronic system 900 also includes a display device 950, and an audio output 960. In an embodiment, the electronic system 900 includes an input device such as a controller 970 that may be a keyboard, mouse, touch pad, keypad, trackball, game controller, microphone, voice-recognition device, or any other input device that inputs information into the electronic system 900. In an embodiment, an input device 970 includes a camera. In an embodiment, an input device 970 includes a digital sound recorder. In an embodiment, an input device 970 includes a camera and a digital sound recorder.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to particular exemplary embodiments.

In an embodiment, an apparatus includes a packaging build-up, the build-up including a plurality of alternating layers of patterned conductive material and insulating material. A first device is physically coupled to the build-up and electrically coupled to at least one of the conductive material layers. A magnetic field shielding material is disposed in contact with the build-up and in proximity to the first device to restrict a magnetic field within the build-up In a further embodiment, the device is a micro electromechanical system (MEMS) device and the shielding material is to restrict the field outside of a region of the build-up occupied by the MEMS device.

In a further embodiment, a permanent magnet is physically coupled to the build-up. A micro electromechanical system (MEMS) has one or more released member disposed on a same side of the magnetic field shielding material as the magnet, and the first device is an integrated circuit or a second MEMS device.

In a further embodiment, a permanent magnet is physically coupled to the build-up. A micro electromechanical system (MEMS) has one or more released member disposed in a void within the build-up. The magnetic field shielding material comprises at least one of: a bottom-side field shielding material extending over an area of the build-up and disposed facing a first side of the magnet opposite the released member; or a top-side field shielding material extending over an area of the build-up and disposed facing a second side of the magnet with the released member disposed between the top-side field shielding material and the magnet; or a lateral field shielding material disposed facing to a third side of the magnet and extending in a direction non-parallel to a bottom-side or top-side of the build-up.

In a further embodiment, a permanent magnet is physically embedded in a first dielectric material layer of the build-up. A micro electromechanical system (MEMS) has one or more released member disposed in a void within the build-up. The magnetic field shielding material comprises: a bottom-side field shielding material extending over an area of the build-up and disposed between a first side of the magnet opposite the released member and the first dielectric material layer; and a lateral field shielding material disposed between a sidewall of the magnet and the first dielectric material layer, the lateral field shielding material extending in a direction non-parallel to the bottom-side shielding material.

In a further embodiment, a permanent magnet is physically embedded in a first dielectric material layer of the build-up. A micro electromechanical system (MEMS) has one or more released member disposed in a void within the build-up. The magnetic field shielding material comprises: a bottom-side field shielding material extending over an area of the build-up and disposed between a first side of the magnet opposite the released member and the first dielectric material layer; and a lateral field shielding material disposed between a second side of the magnet and the first dielectric material layer, the lateral field shielding material extending in a direction non-parallel to the bottom-side shielding material and wrapping around a portion of the third side of the magnet proximate the released member.

In a further embodiment, a permanent magnet is physically embedded in a first dielectric material layer of the build-up. A micro electromechanical system (MEMS) has one or more released member disposed in a void within the build-up. The magnetic field shielding material comprises: a bottom-side field shielding material extending over an area of the build-up, wherein the first dielectric material layer is disposed between a first side of the magnet opposite the released member and the bottom-side field shielding material; and a lateral field shielding material extending in a direction non-parallel to the bottom-side shielding material. The first dielectric material layer is disposed between the lateral field shielding material and a sidewall of the magnet.

In a further embodiment, a permanent magnet is physically embedded in a first dielectric material layer of the build-up. A micro electromechanical system (MEMS) has one or more released member disposed in a void within the build-up. The magnetic field shielding material comprises: a bottom-side field shielding material extending over an area of the build-up larger than the magnet, wherein the first dielectric material layer is absent from a region between a first side of the magnet opposite the released member and the bottom-side field shielding material; and a lateral field shielding material adjacent to a sidewall of the magnet and extending through the first dielectric material in a direction non-parallel to the bottom-side shielding material. The first dielectric material layer is disposed between the lateral field shielding material and the sidewall of the magnet.

In a further embodiment, a permanent magnet is physically embedded in a first dielectric material layer of the build-up. A micro electromechanical system (MEMS) has one or more released member disposed in a void within the build-up. The magnetic field shielding material comprises a bottom-side field shielding material layer extending over an area of the build-up larger than the magnet, wherein the first dielectric material layer is absent from a region between a first side of the magnet opposite the released member and the bottom-side field shielding material. The magnetic field shielding material further comprises a top-side field shielding material layer extending over an area of the build-up and on a side of the released member opposite the magnet. The magnetic field shielding material further comprises a plurality of stacked vias filled with field shielding material. The stacked vias are adjacent to a sidewall of the magnet and extending through at least the first dielectric material and a second dielectric material disposed over the first dielectric material. The first dielectric material layer is disposed between the plurality of through vias and the sidewall of the magnet.

In an embodiment, an apparatus includes a processor, a battery, and any of the apparatus embodiments listed above is coupled to the processor and battery.

In an embodiment, a method of forming a packaging build-up includes building-up a plurality of alternating layers of patterned conductive material and insulating material. A permanent magnet is integrated with the build-up. A magnetic field shielding material is further integrated with the build-up to restrict the field of the magnet beyond a region of the build-up occupied by the magnet.

In a further embodiment, integrating the magnet and shielding material with the build up further comprises covering one or more sides of the magnet in the shielding material, affixing the shielded magnet to a sacrificial carrier, forming a first dielectric material around one or more shielded sides of the magnet, and removing the sacrificial carrier.

In a further embodiment, integrating the magnet and shielding material with the build up further comprises covering a sidewall and bottom-side of the magnet in the shielding material, affixing the shielded magnet to a sacrificial carrier with top-side of the magnet facing the carrier, forming a first dielectric material around one or more shielded sides of the magnet, and removing the sacrificial carrier. The method further comprises forming a MEMS device over the magnet top side and within layers of the build-up disposed over the first dielectric material.

In a further embodiment, integrating the magnet and shielding material with the build up further comprises affixing the magnet to a sacrificial carrier, affixing a magnetic field shielding guard ring to the sacrificial carrier to face one or more sides of the magnet, forming a first dielectric material around one or more sides of the magnet and the guard ring, and removing the sacrificial carrier.

In a further embodiment, integrating the magnet and shielding material with the build up further comprises affixing the magnet to a sacrificial carrier, affixing a magnetic field shielding guard ring to the sacrificial carrier to face one or more sides of the magnet, forming a first dielectric material around one or more sides of the magnet and the guard ring, and removing the sacrificial carrier. The method further comprises forming a MEMS device over the magnet top side and within layers of the build-up disposed over a region of the first dielectric material disposed inside of the guard ring.

In a further embodiment, integrating the magnet and magnetic shielding material with the build up further comprises forming a bottom-side shielding material layer over a substrate, affixing the magnet over the bottom-side shielding material layer, laminating a first dielectric material layer over the magnet and bottom-side shielding material layer, patterning an opening the first dielectric material layer to expose a region of the bottom-side shielding material layer, and depositing a magnetic shielding material into the opening. The method further comprises forming a MEMS device over the magnet and within layers of the build-up disposed over a region of the first dielectric material.

In a further embodiment, integrating the magnet and magnetic shielding material with the build up further comprises forming a bottom-side shielding material layer over a substrate, affixing the magnet over the bottom-side shielding material layer, laminating a first dielectric material layer over the magnet and bottom-side shielding material layer, patterning a plurality of first openings through the first dielectric material layer to expose regions of the bottom-side shielding material layer, the plurality of openings forming an array of vias surrounding the magnet, depositing a first magnetic shielding material into the openings, laminating a second dielectric material layer over the first dielectric layer, patterning a plurality of second openings through the second dielectric material layer to expose regions of the first magnetic shielding material, the plurality of second openings vertically stacked over the plurality of first openings, and depositing a second magnetic shielding material into the second openings. The method further comprises forming a MEMS device over the magnet and within layers of the build-up.

In a further embodiment, integrating the permanent magnet further comprises embedding a permanent magnet within a first dielectric layer of the build-up with a magnetic pole oriented parallel to a z-thickness of the build-up. The magnet has a z-thickness less than 400 μm. In the further embodiment, integrating the magnetic field shielding material further comprises disposing a material having a relative permeability higher than 500 in contact with the first dielectric layer.

In a further embodiment, any of the method embodiments described above, further include integrating an IC chip within a region of the build-up spaced laterally from the magnet. In the further embodiment a MEMS device is integrated within a region of the build-up disposed over the magnet. In the further embodiment, integrating the magnet further comprises embedding a permanent magnet within the build-up with a magnetic pole oriented toward the MEMS device. In the further embodiment, integrating the magnetic field shielding material further comprises disposing a material having a relative permeability higher than 500 in contact with the build-up.

In a further embodiment, for any of the method embodiments listed above, integrating the magnetic field shielding material further comprises disposing a material having a relative permeability higher than 25000 in contact with the build-up.

In an embodiment, an apparatus includes a packaging build-up, the build-up including a plurality of alternating layers of patterned conductive material and insulating material. The apparatus further includes a permanent magnet physically coupled to the build-up. The apparatus further includes a magnetic field shielding material disposed in contact with the build-up. The apparatus further includes a micro electromechanical system (MEMS) having one or more released member disposed on a same side of the magnetic field shielding material as the magnet. In the embodiment, the magnetic field shielding material comprises at least one of a bottom-side field shielding material extending over an area of the build-up and disposed facing a first side of the magnet opposite the released member, or a top-side field shielding material extending over an area of the build-up and disposed facing a second side of the magnet with the released member disposed between the top-side field shielding material and the magnet.

In a further embodiment, the apparatus further includes a lateral magnetic field shield comprising a plurality of vias filled with material having a relative permeability over 500, the vias adjacent to a sidewall of the magnet and extending through at least a portion of the build-up.

In a further embodiment, the apparatus further includes a lateral magnetic field shield comprising a plurality of stacked vias filled with material having a relative permeability over 500, the stacked vias adjacent to a sidewall of the magnet and extending completely through the build-up.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus comprising:
a packaging build-up, the build-up including a plurality of alternating layers of patterned conductive material and insulating material;
a permanent magnet physically coupled to the build-up;
a first device physically coupled to the build-up and electrically coupled to at least one of the conductive material layers; and
a magnetic field shielding material disposed in contact with the build-up and in proximity to the first device or magnet.

2. The apparatus of claim 1, wherein:
the device is a micro electromechanical system (MEMS) device; and
the shielding material is to restrict the field outside of a region of the build-up occupied by the MEMS device.

3. The apparatus of claim 1, further comprising:
a micro electromechanical system (MEMS) having one or more released member disposed on a same side of the magnetic field shielding material as the magnet, and
wherein the first device is an integrated circuit or a second MEMS device.

4. The apparatus of claim 1, further comprising:
a micro electromechanical system (MEMS) having-one or more released member disposed in a void within the build-up; and
wherein the magnetic field shielding material comprises at least one of:
a bottom-side field shielding material extending over an area of the build-up and disposed facing a first side of the magnet opposite the released member; or
a top-side field shielding material extending over an area of the build-up and disposed facing a second side of the magnet with the released member disposed between the top-side field shielding material and the magnet; or
a lateral field shielding material disposed facing to a third side of the magnet and extending in a direction non-parallel to a bottom-side or top-side of the build-up.

5. The apparatus of claim 1, wherein:
the permanent magnet is physically embedded in a first dielectric material layer of the build-up; and
further comprising a micro electromechanical system (MEMS) having-one or more released member disposed in a void within the build-up; and
wherein the magnetic field shielding material comprises:
a bottom-side field shielding material extending over an area of the build-up and disposed between a first side of the magnet opposite the released member and the first dielectric material layer; and a lateral field shielding material disposed between a sidewall of the magnet and the first dielectric material layer, the lateral field shielding material extending in a direction non-parallel to the bottom-side shielding material.

6. The apparatus of claim 1, wherein:

the permanent magnet is physically embedded in a first dielectric material layer of the build-up; and further comprising a micro electromechanical system (MEMS) having-one or more released member disposed in a void within the build-up; and wherein the magnetic field shielding material comprises:
  a bottom-side field shielding material extending over an area of the build-up and disposed between a first side of the magnet opposite the released member and the first dielectric material layer; and
  a lateral field shielding material disposed between a second side of the magnet and the first dielectric material layer, the lateral field shielding material extending in a direction non-parallel to the bottom-side shielding material and wrapping around a portion of the third side of the magnet proximate the released member.

7. The apparatus of claim 1, wherein:

the permanent magnet is physically embedded in a first dielectric material layer of the build-up; and further comprising a micro electromechanical system (MEMS) having-one or more released member disposed in a void within the build-up; and wherein the magnetic field shielding material comprises:
  a bottom-side field shielding material extending over an area of the build-up, wherein the first dielectric material layer is disposed between a first side of the magnet opposite the released member and the bottom-side field shielding material; and
  a lateral field shielding material extending in a direction non-parallel to the bottom-side shielding material, wherein the first dielectric material layer is disposed between the lateral field shielding material and a sidewall of the magnet.

8. The apparatus of claim 1, wherein:

the permanent magnet is physically embedded in a first dielectric material layer of the build-up; and further comprising a micro electromechanical system (MEMS) having-one or more released member disposed in a void within the build-up; and wherein the magnetic field shielding material comprises:
  a bottom-side field shielding material extending over an area of the build-up larger than the magnet, wherein the first dielectric material layer is absent from a region between a first side of the magnet opposite the released member and the bottom-side field shielding material; and
  a lateral field shielding material adjacent to a sidewall of the magnet and extending through the first dielectric material in a direction non-parallel to the bottom-side shielding material, wherein the first dielectric material layer is disposed between the lateral field shielding material and the sidewall of the magnet.

9. The apparatus of claim 1, wherein:

the permanent magnet is physically embedded in a first dielectric material layer of the build-up; and further comprising a micro electromechanical system (MEMS) having-one or more released member disposed in a void within the build-up; and wherein the magnetic field shielding material comprises:

a bottom-side field shielding material layer extending over an area of the build-up larger than the magnet, wherein the first dielectric material layer is absent from a region between a first side of the magnet opposite the released member and the bottom-side field shielding material;

a top-side field shielding material layer extending over an area of the build-up and on a side of the released member opposite the magnet; and a plurality of stacked vias filled with field shielding material, the stacked vias adjacent to a sidewall of the magnet and extending through at least the first dielectric material and a second dielectric material disposed over the first dielectric material, wherein the first dielectric material layer is disposed between the plurality of through vias and the sidewall of the magnet.

10. A method of forming a packaging build-up, the method comprising:

building-up a plurality of alternating layers of patterned conductive material and insulating material;

integrating a permanent magnet with the build-up; and integrating a magnetic field shielding material with the build-up to restrict the field of the magnet beyond a region of the build-up occupied by the magnet.

11. The method of claim 10, wherein integrating the magnet and shielding material with the build up further comprises:

covering one or more sides of the magnet in the shielding material;

affixing the shielded magnet to a sacrificial carrier;

forming a first dielectric material around one or more shielded sides of the magnet; and removing the sacrificial carrier.

12. The method of claim 10, wherein:

integrating the magnet and shielding material with the build up further comprises:

covering a sidewall and bottom-side of the magnet in the shielding material;

affixing the shielded magnet to a sacrificial carrier with top-side of the magnet facing the carrier;

forming a first dielectric material around one or more shielded sides of the magnet; and removing the sacrificial carrier; and the method further comprises forming a MEMS device over the magnet top side and within layers of the build-up disposed over the first dielectric material.

13. The method of claim 10, wherein:

integrating the magnet and shielding material with the build up further comprises:

affixing the magnet to a sacrificial carrier;

affixing a magnetic field shielding guard ring to the sacrificial carrier to face one or more sides of the magnet;

forming a first dielectric material around one or more sides of the magnet and the guard ring; and removing the sacrificial carrier.

14. The method of claim 10, wherein:

integrating the magnet and shielding material with the build up further comprises:

affixing the magnet to a sacrificial carrier;

affixing a magnetic field shielding guard ring to the sacrificial carrier to face one or more sides of the magnet;

forming a first dielectric material around one or more sides of the magnet and the guard ring;

removing the sacrificial carrier; and the method further comprises forming a MEMS device over the magnet top side and within layers of the build-up disposed over a region of the first dielectric material disposed inside of the guard ring.

15. The method of claim 10, wherein:
integrating the magnet and magnetic shielding material with the build up further comprises:
    forming a bottom-side shielding material layer over a substrate;
    affixing the magnet over the bottom-side shielding material layer;
    laminating a first dielectric material layer over the magnet and bottom-side shielding material layer;
    patterning an opening the first dielectric material layer to expose a region of the bottom-side shielding material layer; and
    depositing a magnetic shielding material into the opening; and
the method further comprises forming a MEMS device over the magnet and within layers of the build-up disposed over a region of the first dielectric material.

16. The method of claim 10, wherein:
integrating the magnet and magnetic shielding material with the build up further comprises:
    forming a bottom-side shielding material layer over a substrate;
    affixing the magnet over the bottom-side shielding material layer;
    laminating a first dielectric material layer over the magnet and bottom-side shielding material layer;
    patterning a plurality of first openings through the first dielectric material layer to expose regions of the bottom-side shielding material layer, the plurality of openings forming an array of vias surrounding the magnet;
    depositing a first magnetic shielding material into the openings;
    laminating a second dielectric material layer over the first dielectric layer;
    patterning a plurality of second openings through the second dielectric material layer to expose regions of the first magnetic shielding material, the plurality of second openings vertically stacked over the plurality of first openings; and
    depositing a second magnetic shielding material into the second openings; and
the method further comprises forming a MEMS device over the magnet and within layers of the build-up.

17. An apparatus comprising:
a packaging build-up, the build-up including a plurality of alternating layers of patterned conductive material and insulating material;
a permanent magnet physically coupled to the build-up;
a magnetic field shielding material disposed in contact with the build-up; and
a micro electromechanical system (MEMS) having one or more released member disposed on a same side of the magnetic field shielding material as the magnet,
wherein the magnetic field shielding material comprises at least one of:
    a bottom-side field shielding material extending over an area of the build-up and disposed facing a first side of the magnet opposite the released member; or
    a top-side field shielding material extending over an area of the build-up and disposed facing a second side of the magnet with the released member disposed between the top-side field shielding material and the magnet.

18. The apparatus of claim 17, further comprising a lateral magnetic field shield comprising a plurality of vias filled with material having a relative permeability over 500, the vias adjacent to a sidewall of the magnet and extending through at least a portion of the build-up.

19. The apparatus of claim 17, further comprising a lateral magnetic field shield comprising a plurality of stacked vias filled with material having a relative permeability over 500, the stacked vias adjacent to a sidewall of the magnet and extending completely through the build-up.

20. A mobile device, comprising:
a processor;
a battery; and
an apparatus, comprising:
    a packaging build-up, the build-up including a plurality of alternating layers of patterned conductive material and dielectric material;
    a permanent magnet physically embedded in a first dielectric material layer of the build-up;
    a first device physically coupled to the build-up and electrically coupled to at least one of the conductive material layers; and
    a magnetic field shielding material disposed in contact with the build-up and in proximity to the first device to restrict a magnetic field within the build-up,
    wherein the apparatus is coupled to the processor and battery.

21. The apparatus of claim 20, further comprising:
a micro electromechanical system (MEMS) having one or more released member disposed in a void within the build-up; and
wherein the magnetic field shielding material comprises;
a bottom-side field shielding material extending over an area of the build-up larger than the magnet, wherein the first dielectric material layer is absent from a region between a first side of the magnet opposite the released member and the bottom-side field shielding material; and
a lateral field shielding material adjacent to a sidewall of the magnet and extending through the first dielectric material in a direction non-parallel to the bottom-side shielding material, wherein the first dielectric material layer is disposed between the lateral field shielding material and the sidewall of the magnet.

22. The apparatus of claim 20, further comprising:
a permanent magnet physically embedded in a first dielectric material layer of the build-up; and
a micro electromechanical system (MEMS) having one or more released member disposed in a void within the build-up; and
wherein the magnetic field shielding material comprises;
a bottom-side field shielding material layer extending over an area of the build-up larger than the magnet, wherein the first dielectric material layer is absent from a region between a first side of the magnet opposite the released member and the bottom-side field shielding material;
a top-side field shielding material layer extending over an area of the build-up and on a side of the released member opposite the magnet; and
a plurality of stacked vias filled with field shielding material, the stacked vias adjacent to a sidewall of the magnet and extending through at least the first dielectric material and a second dielectric material disposed over the first dielectric material, wherein the first dielectric material layer is disposed between the plurality of through vias and the sidewall of the magnet.

* * * * *